US010447059B2

(12) United States Patent
Yajima et al.

(10) Patent No.: US 10,447,059 B2
(45) Date of Patent: *Oct. 15, 2019

(54) ELECTRONIC APPARATUS, METHOD OF CONTROLLING ELECTRONIC APPARATUS, POWER RECEPTION DEVICE, ELECTRIC DEVICE, AND SYSTEM

(71) Applicant: Sony Corporation, Tokyo (JP)

(72) Inventors: Masakazu Yajima, Chiba (JP); Kiminobu Ichimura, Tokyo (JP); Yuichi Ishida, Kanagawa (JP); Yutaka Sugiyama, Saitama (JP); Yoshio Muraoka, Tokyo (JP)

(73) Assignee: Sony Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/117,297

(22) Filed: Aug. 30, 2018

(65) Prior Publication Data

US 2019/0067972 A1  Feb. 28, 2019

Related U.S. Application Data

(63) Continuation of application No. 14/901,022, filed as application No. PCT/JP2014/003326 on Jun. 20, 2014, now Pat. No. 10,097,025.

(30) Foreign Application Priority Data

Jun. 27, 2013 (JP) .................. 2013-135055
Nov. 26, 2013 (JP) .................. 2013-243811

(51) Int. Cl.
*H02J 7/04* (2006.01)
*H02J 7/16* (2006.01)
(Continued)

(52) U.S. Cl.
CPC .......... *H02J 7/0072* (2013.01); *F28D 20/028* (2013.01); *H01L 23/34* (2013.01);
(Continued)

(58) Field of Classification Search
CPC ..................................... H02J 7/0091
(Continued)

(56) References Cited

U.S. PATENT DOCUMENTS 5,795,664 A * 8/1998 Kelly .................. H01M 10/486
320/150
6,057,050 A * 5/2000 Parise .................. B01F 5/0614
429/7
(Continued)

FOREIGN PATENT DOCUMENTS

CN 101620427 A 1/2010
JP 2001-236145 A 8/2001
(Continued)

OTHER PUBLICATIONS

Japanese Office Acton dated Feb. 21, 2017 for corresponding Japanese Application No. 2013-243811.
(Continued)

*Primary Examiner* — Yalkew Fantu
(74) *Attorney, Agent, or Firm* — Michael Best & Friedrich LLP

(57) ABSTRACT

There is provided an electronic apparatus including: a heating section; a heat storage section; a detection section configured to detect a heat storage amount of the heat storage section; and a control section configured to control operation of the heating section, based on the heat storage amount detected by the detection section.

23 Claims, 25 Drawing Sheets

(51) Int. Cl.
*H02J 7/00* (2006.01)
*H02J 50/80* (2016.01)
*H02J 50/10* (2016.01)
*F28D 20/02* (2006.01)
*H01L 23/427* (2006.01)
*H02J 7/02* (2016.01)
*H01L 23/34* (2006.01)
*H01M 10/623* (2014.01)
*H01M 10/659* (2014.01)
*H05K 7/20* (2006.01)
*H02J 50/20* (2016.01)
*H02J 50/12* (2016.01)
*H02J 50/30* (2016.01)
*H02J 50/05* (2016.01)
*H02J 5/00* (2016.01)

(52) U.S. Cl.
CPC ...... *H01L 23/4275* (2013.01); *H01M 10/623* (2015.04); *H01M 10/659* (2015.04); *H02J 7/0047* (2013.01); *H02J 7/025* (2013.01); *H02J 7/047* (2013.01); *H02J 50/10* (2016.02); *H02J 50/80* (2016.02); *H05K 7/209* (2013.01); *H05K 7/20945* (2013.01); *H01L 2924/0002* (2013.01); *H01M 2220/30* (2013.01); *H02J 5/005* (2013.01); *H02J 50/05* (2016.02); *H02J 50/12* (2016.02); *H02J 50/20* (2016.02); *H02J 50/30* (2016.02); *H02J 2007/005* (2013.01); *Y02E 60/145* (2013.01)

(58) Field of Classification Search
USPC ........................................................ 320/152
See application file for complete search history.

(56) References Cited

U.S. PATENT DOCUMENTS

| | | | |
|---|---|---|---|
| 6,914,414 B2 * | 7/2005 | Hamada | H01M 2/1016 320/107 |
| 7,076,375 B2 * | 7/2006 | Raichle | H02J 7/0052 702/63 |
| 2009/0021908 A1 | 1/2009 | Patel et al. | |
| 2011/0127024 A1 * | 6/2011 | Patel | G06F 1/20 165/200 |

FOREIGN PATENT DOCUMENTS

| | | |
|---|---|---|
| JP | 2003-142864 A | 5/2003 |
| JP | 2004-056348 A1 | 3/2004 |
| JP | 2005-202310 A1 | 9/2005 |
| JP | 2006-092894 A | 4/2006 |
| JP | 2007-150521 A | 6/2007 |
| JP | 2008-192664 A | 8/2008 |
| JP | 4485458 B2 | 4/2010 |
| JP | 2010-163510 A | 7/2010 |
| JP | 2011-071597 A1 | 3/2011 |
| JP | 2011-127024 A1 | 6/2011 |
| JP | 2013-106347 A1 | 5/2013 |
| WO | WO-2008/126444 A1 | 10/2008 |

OTHER PUBLICATIONS

Chinese Office Acton dated Mar. 27, 2017 for corresponding Chinese Application No. 201400 352117.

Chinese Office Action dated Feb. 27, 2018 for corresponding Chinese Application No. 201480035211.7.

* cited by examiner

[FIG. 1]
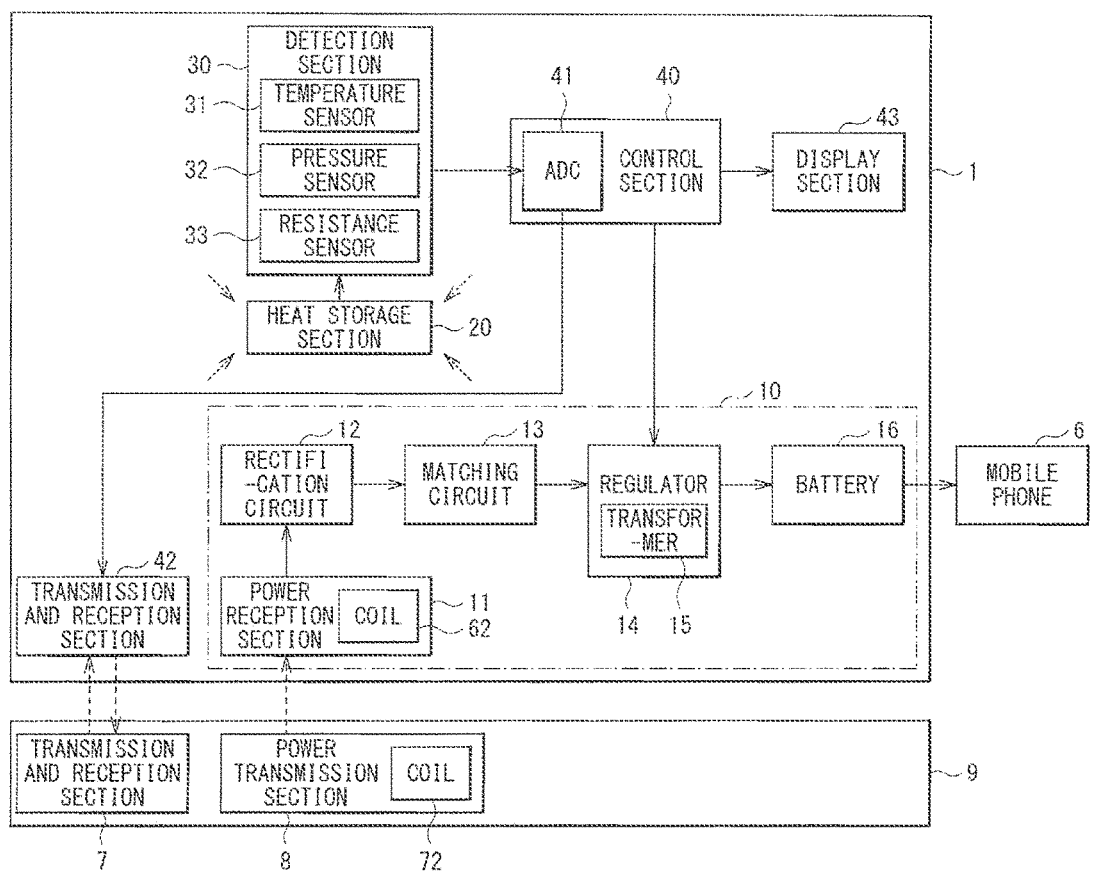

[ FIG. 2 ]
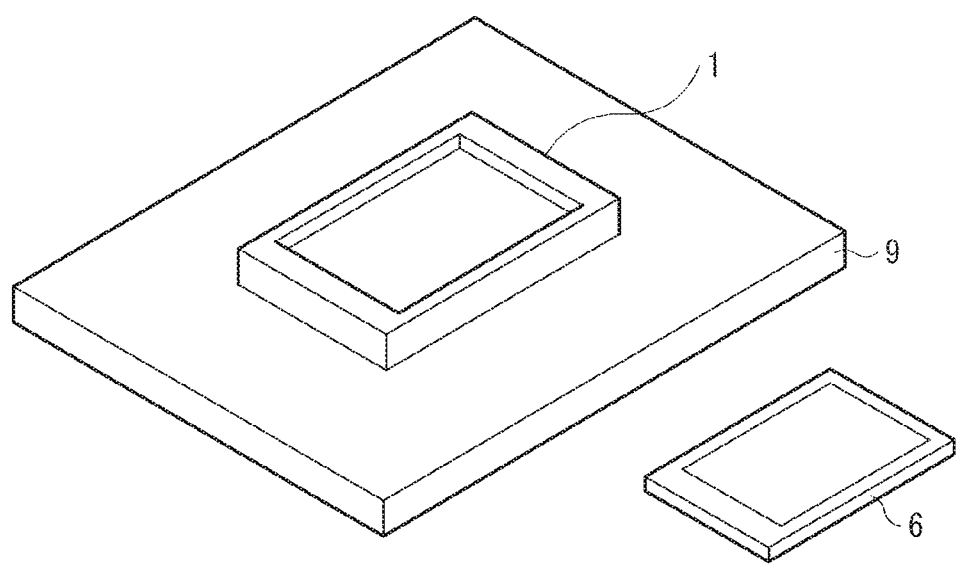
[ FIG. 3 ]
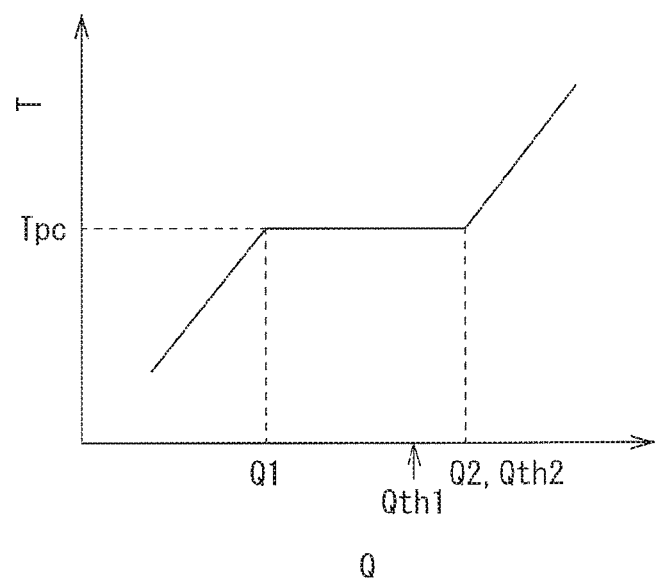

[ FIG. 4A ]
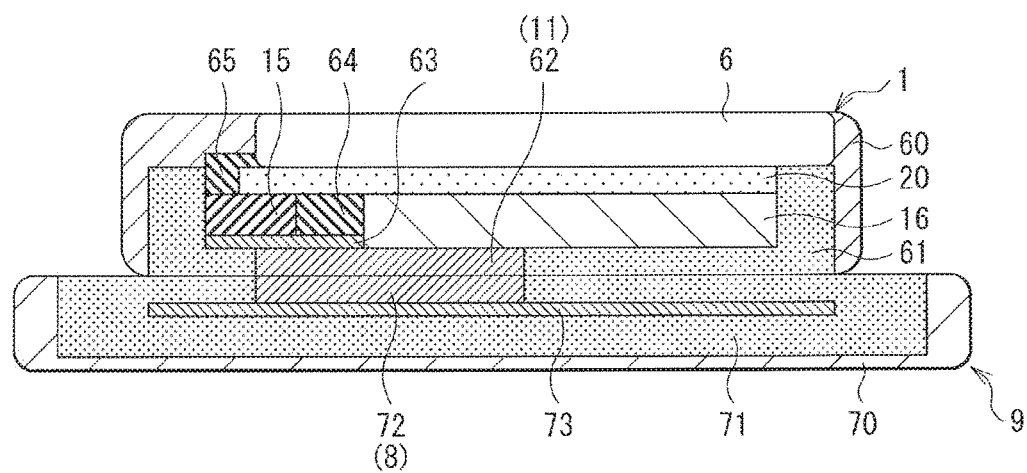
[ FIG. 4B ]
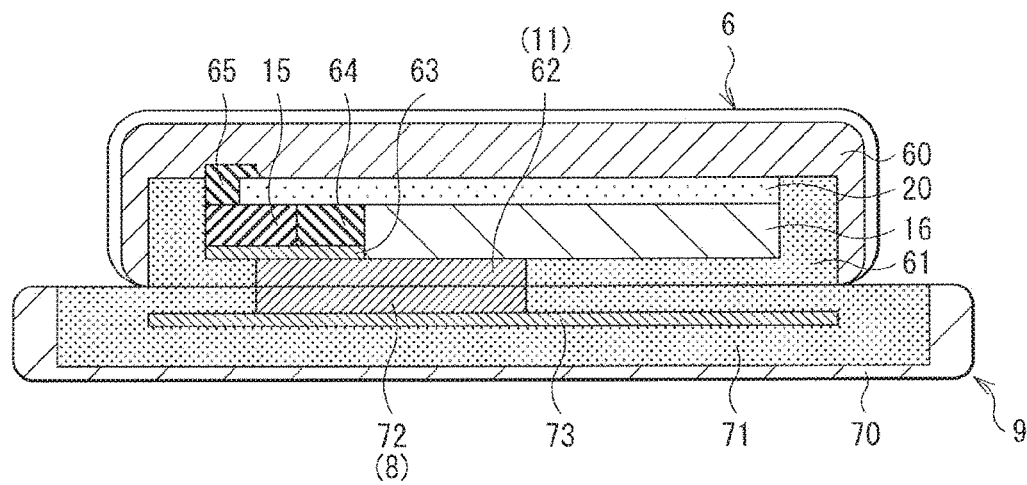

[ FIG. 5 ]
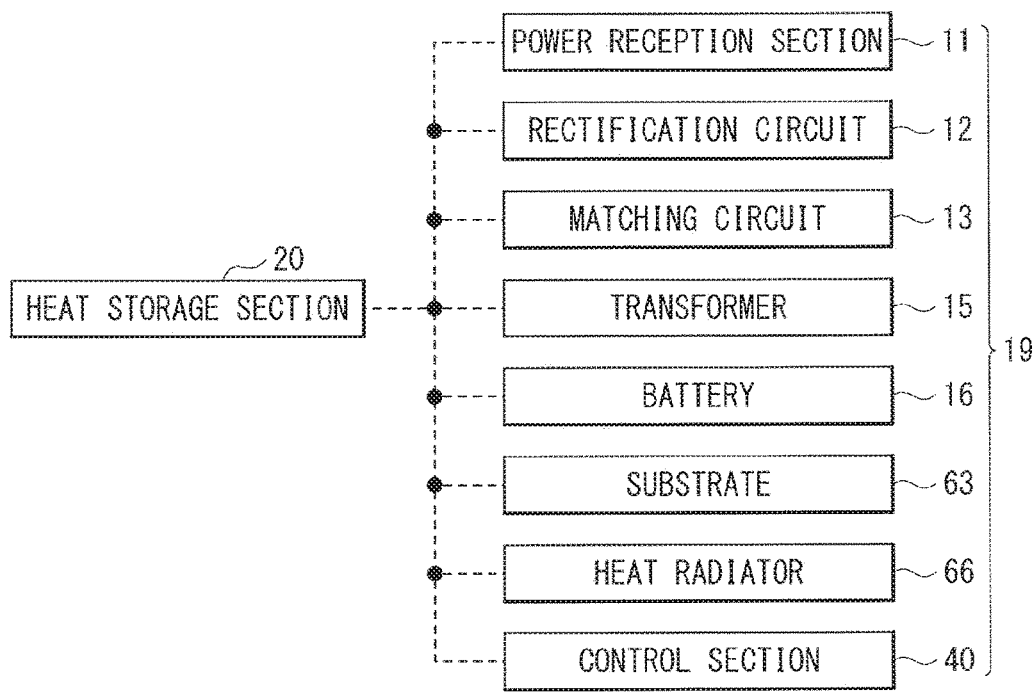

[FIG. 6]
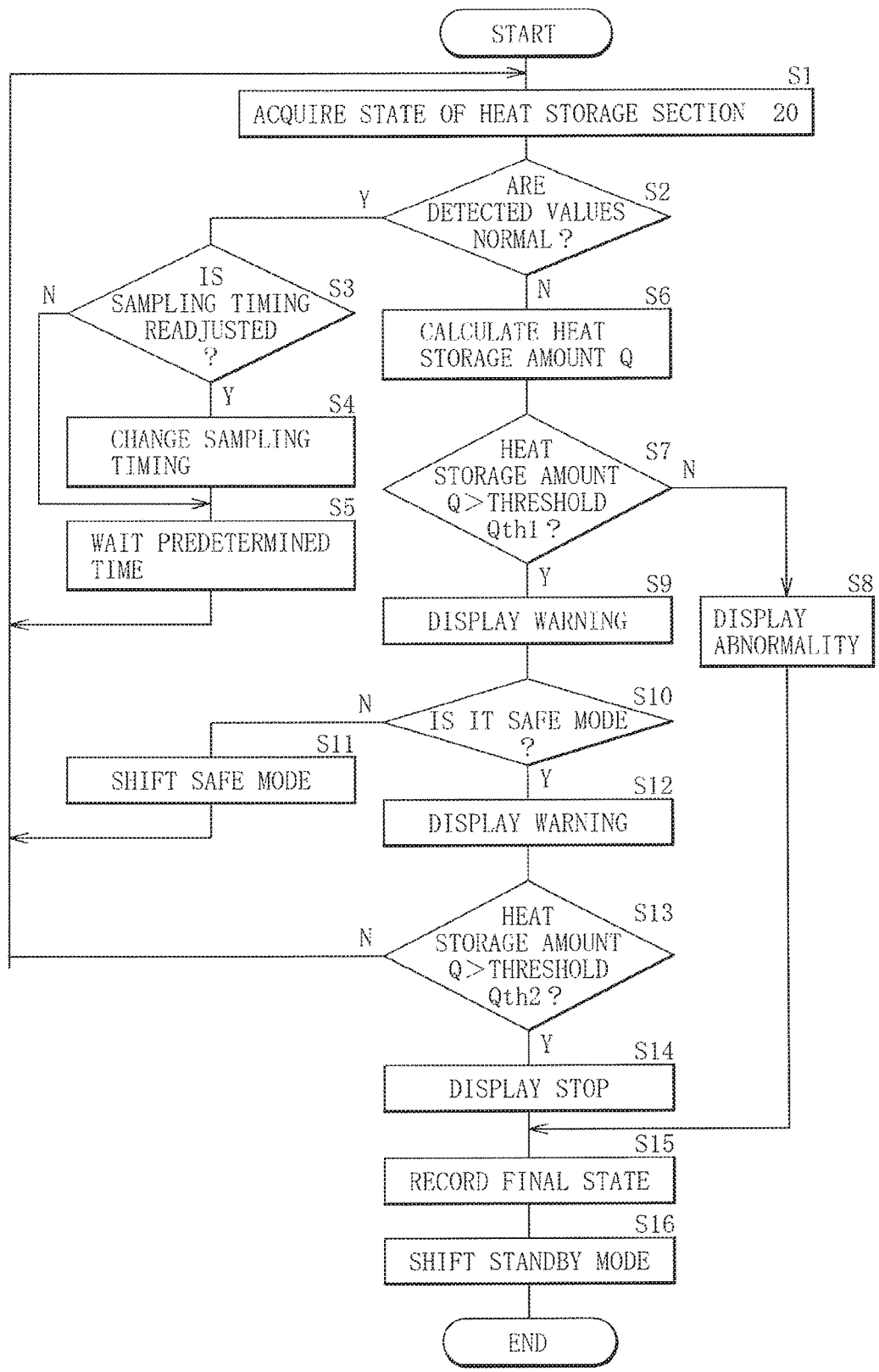

[FIG. 7]
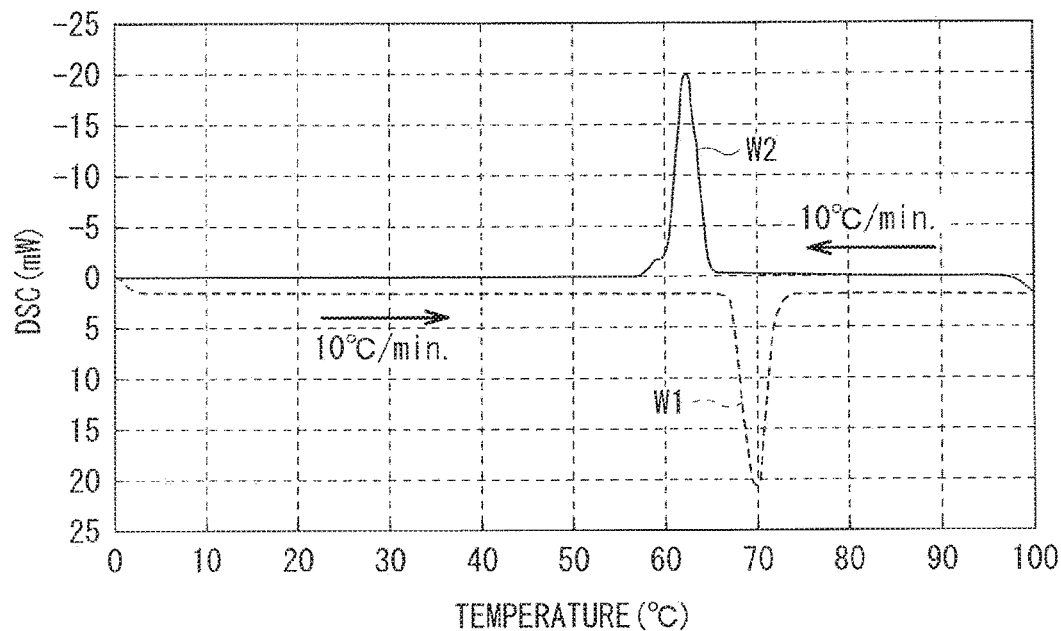
[FIG. 8]
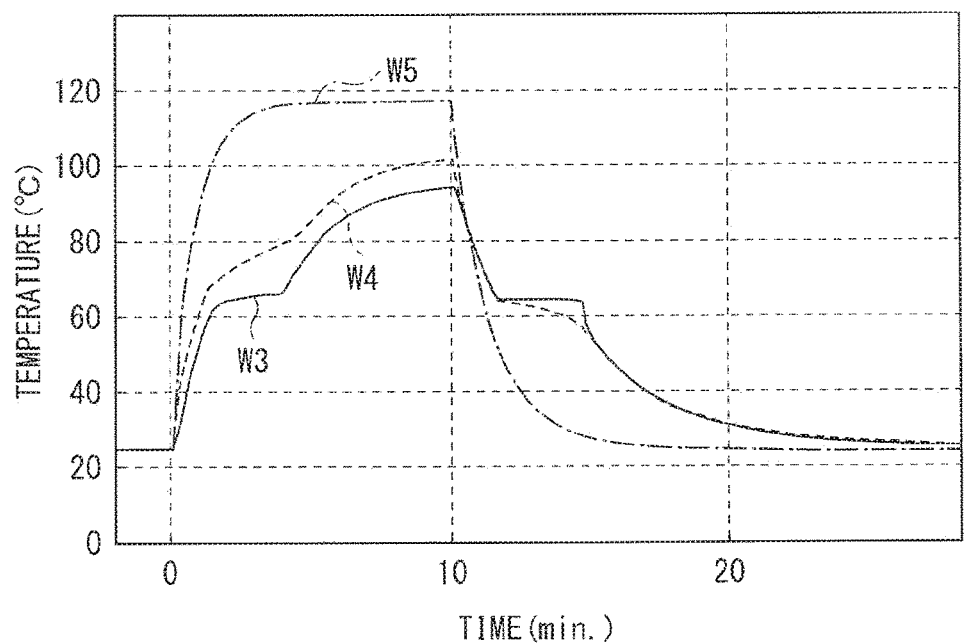

[ FIG. 9A ]
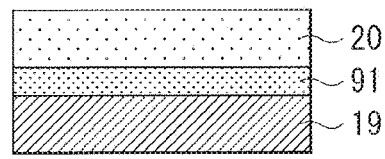
[ FIG. 9B ]
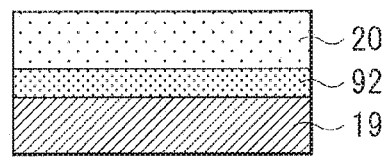
[ FIG. 9C ]
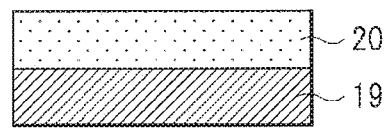
[ FIG. 9D ]
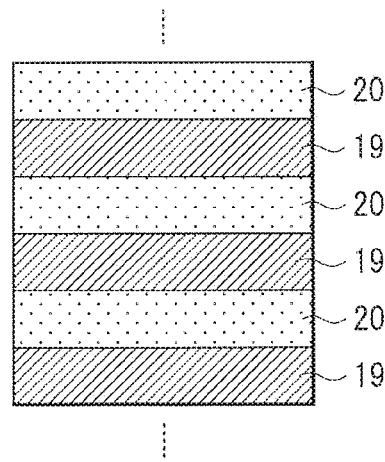
[ FIG. 10 ]
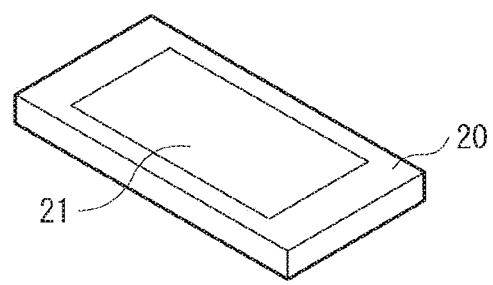

[ FIG. 11 ]
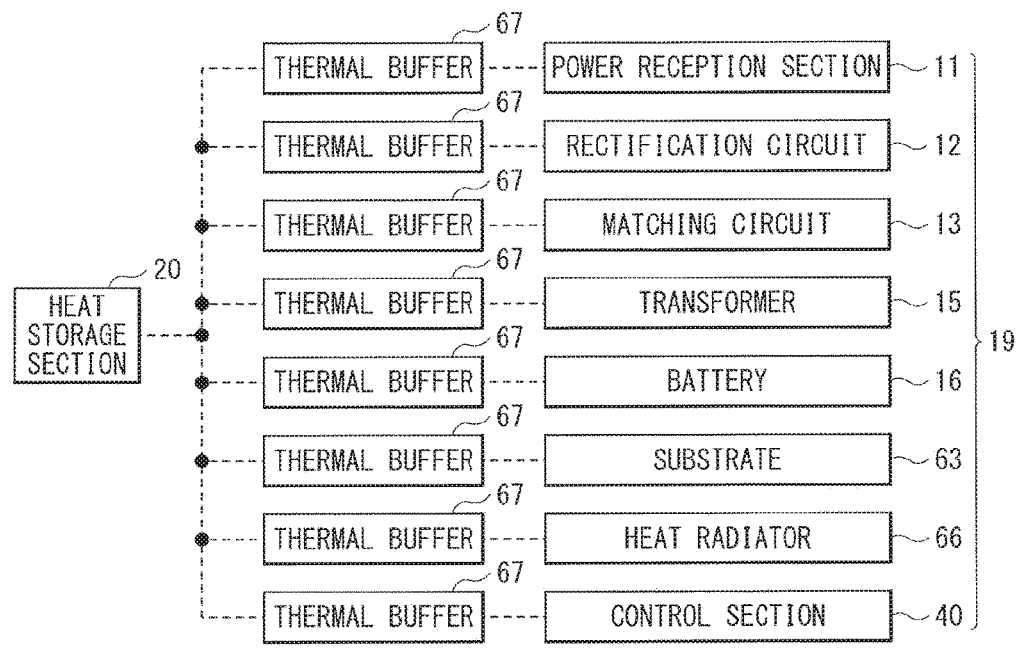
[ FIG. 12 ]
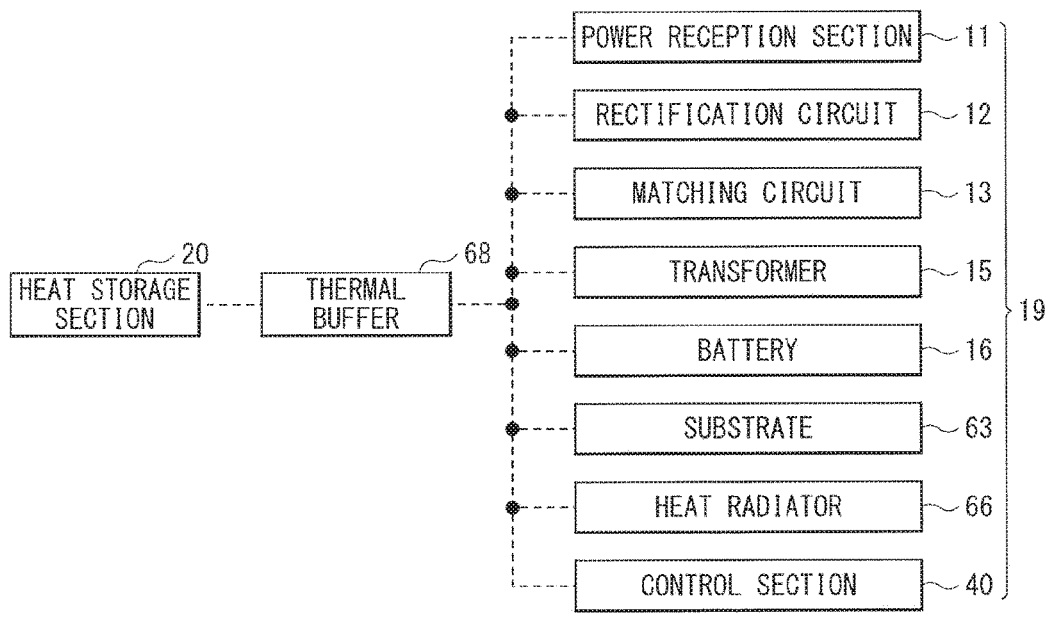

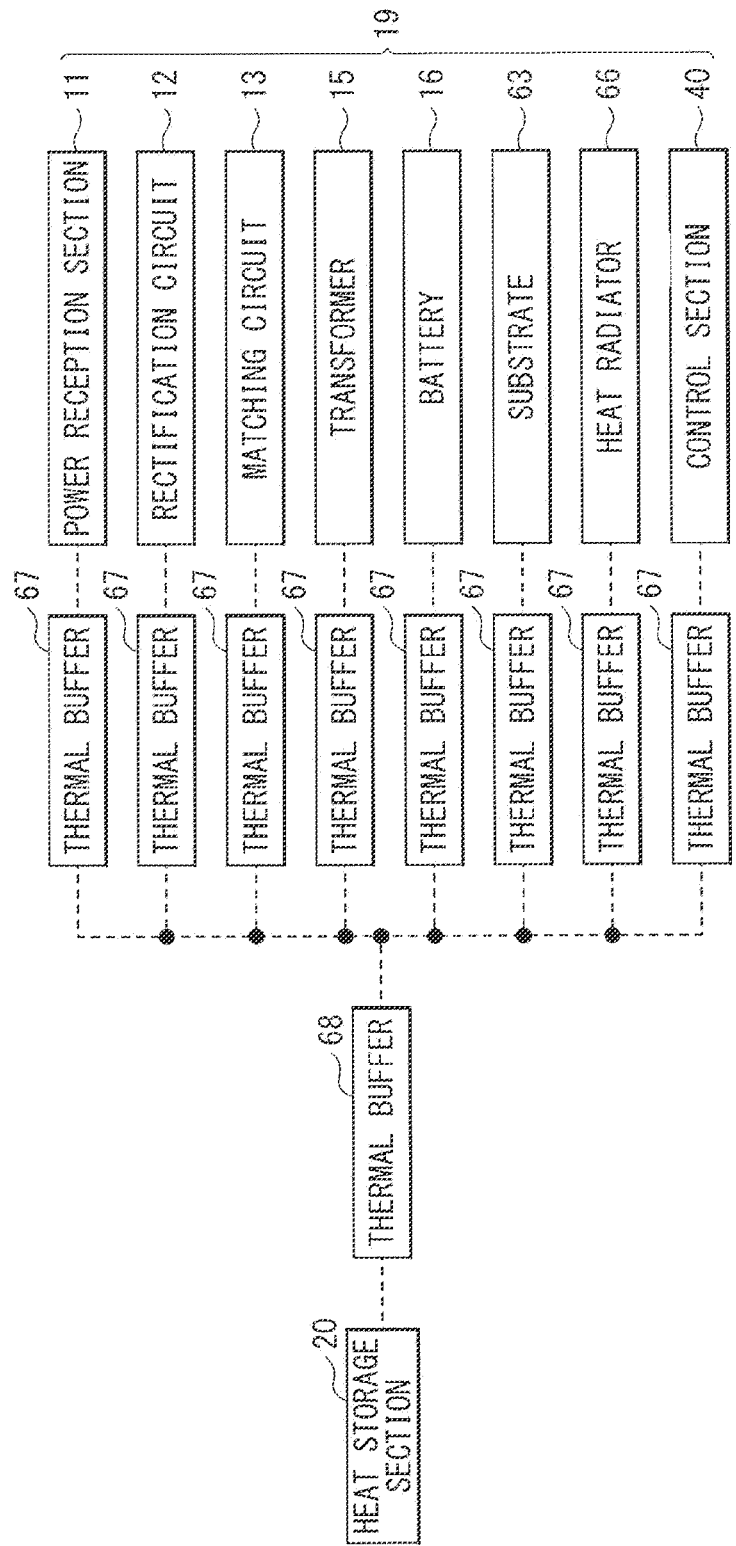
[FIG. 13]

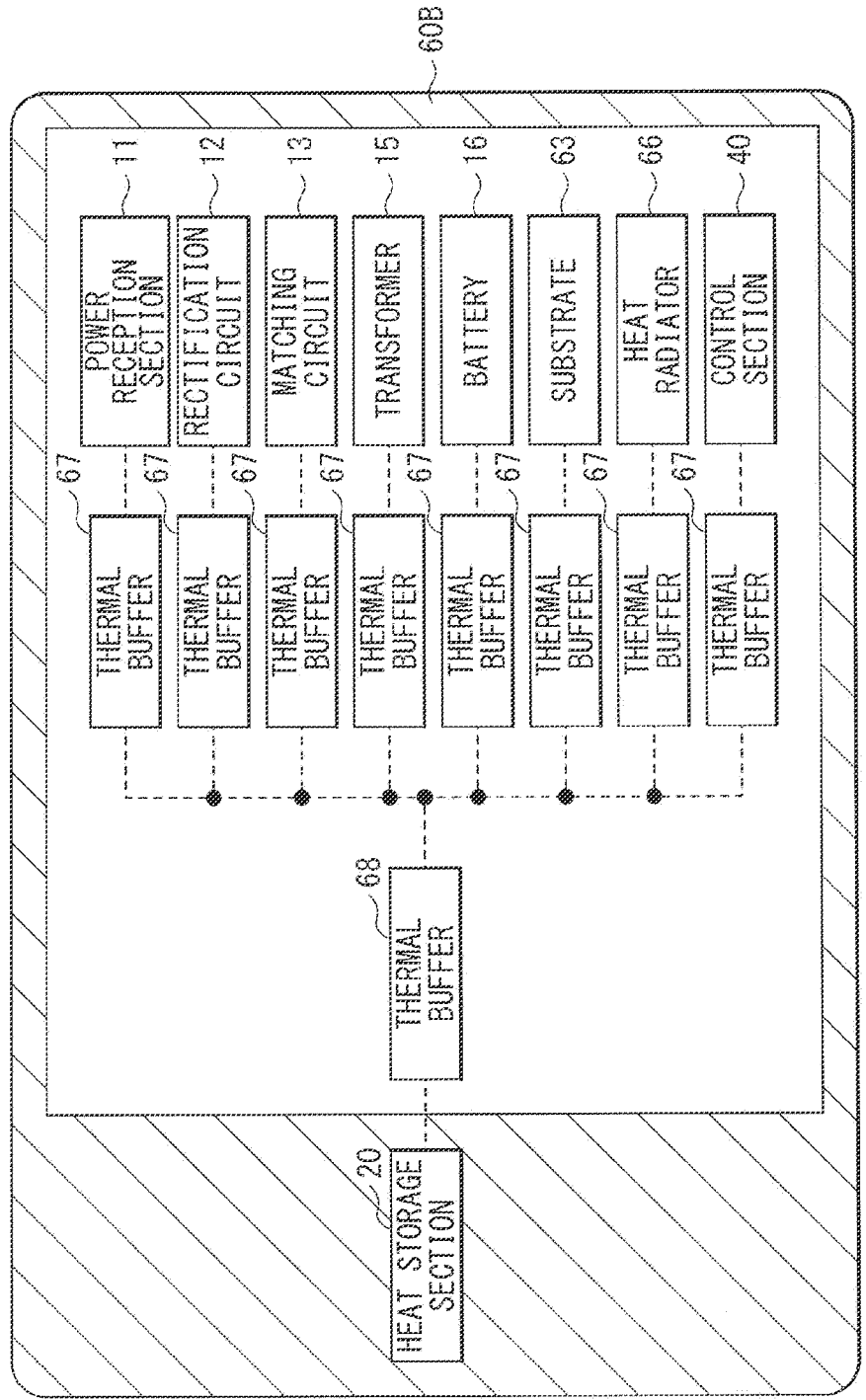
[FIG. 14]

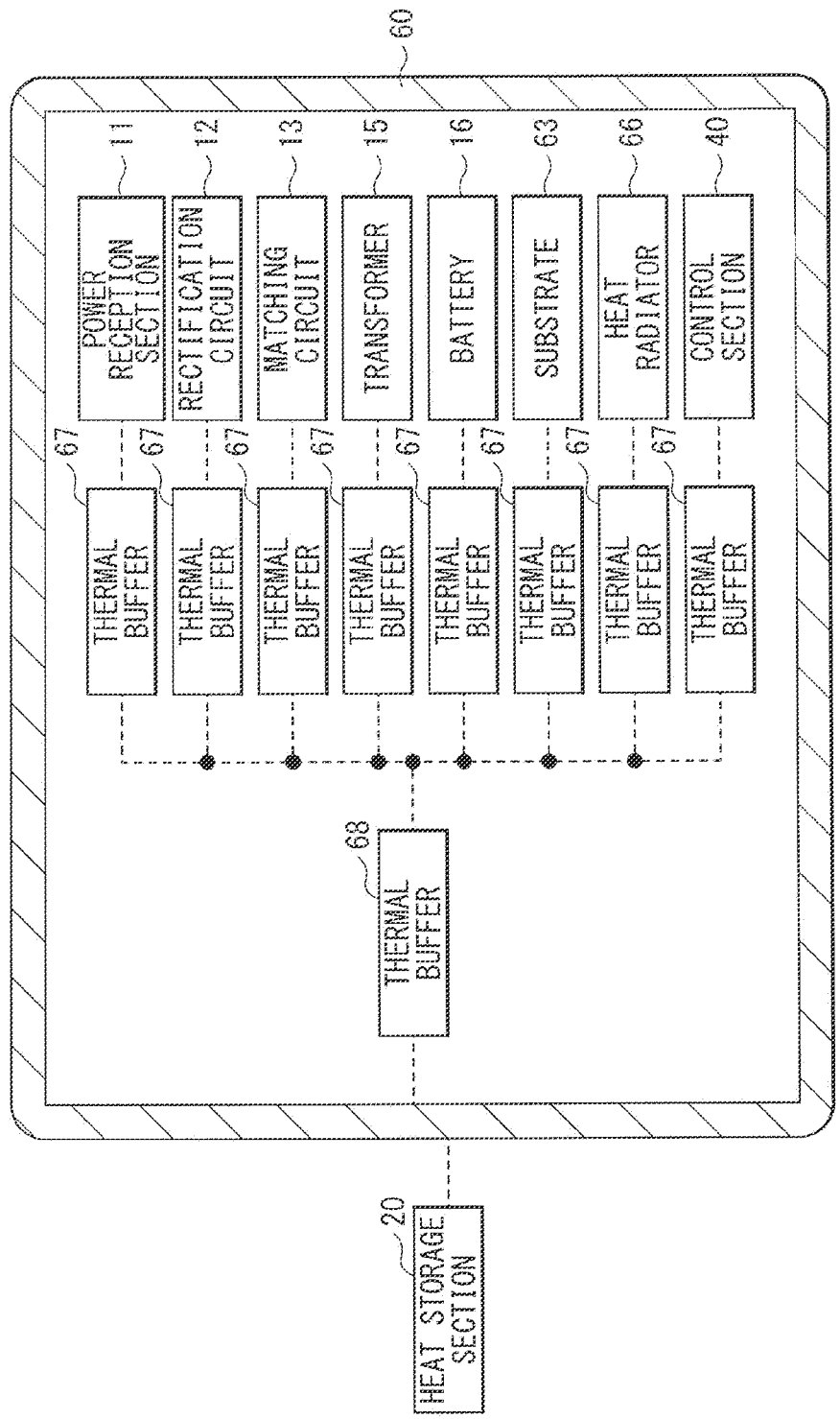
[FIG. 15]

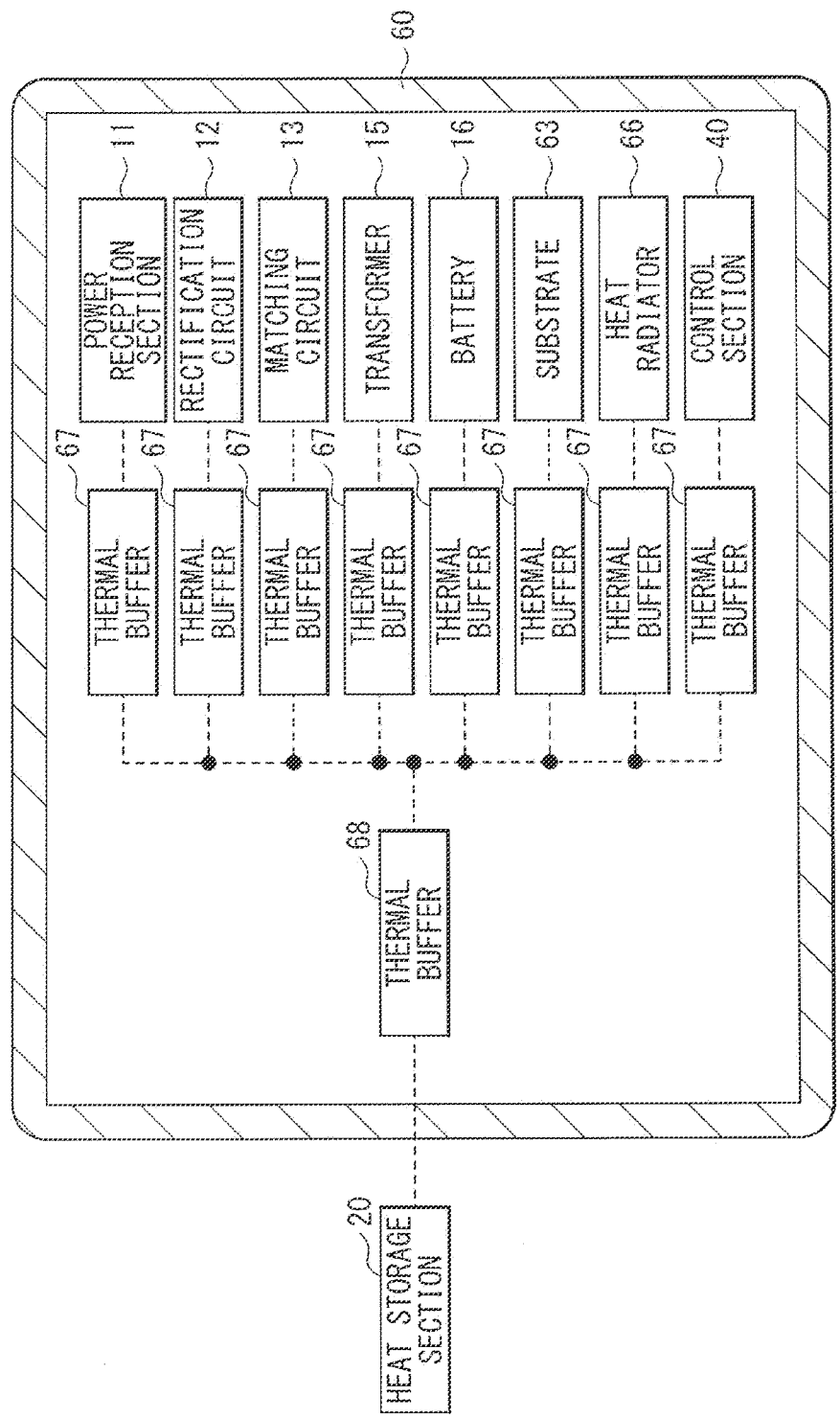
[FIG. 16]

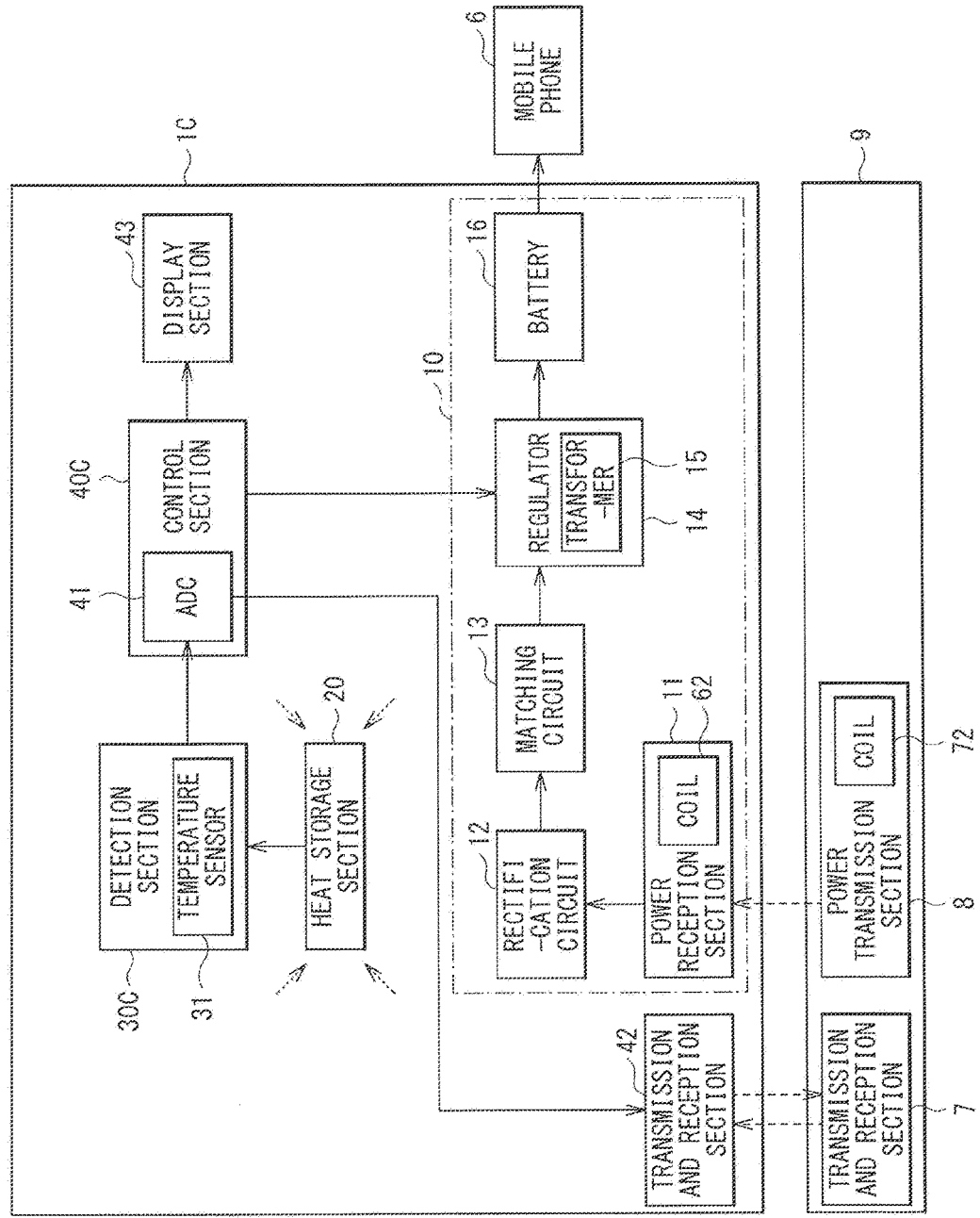
[FIG. 17]

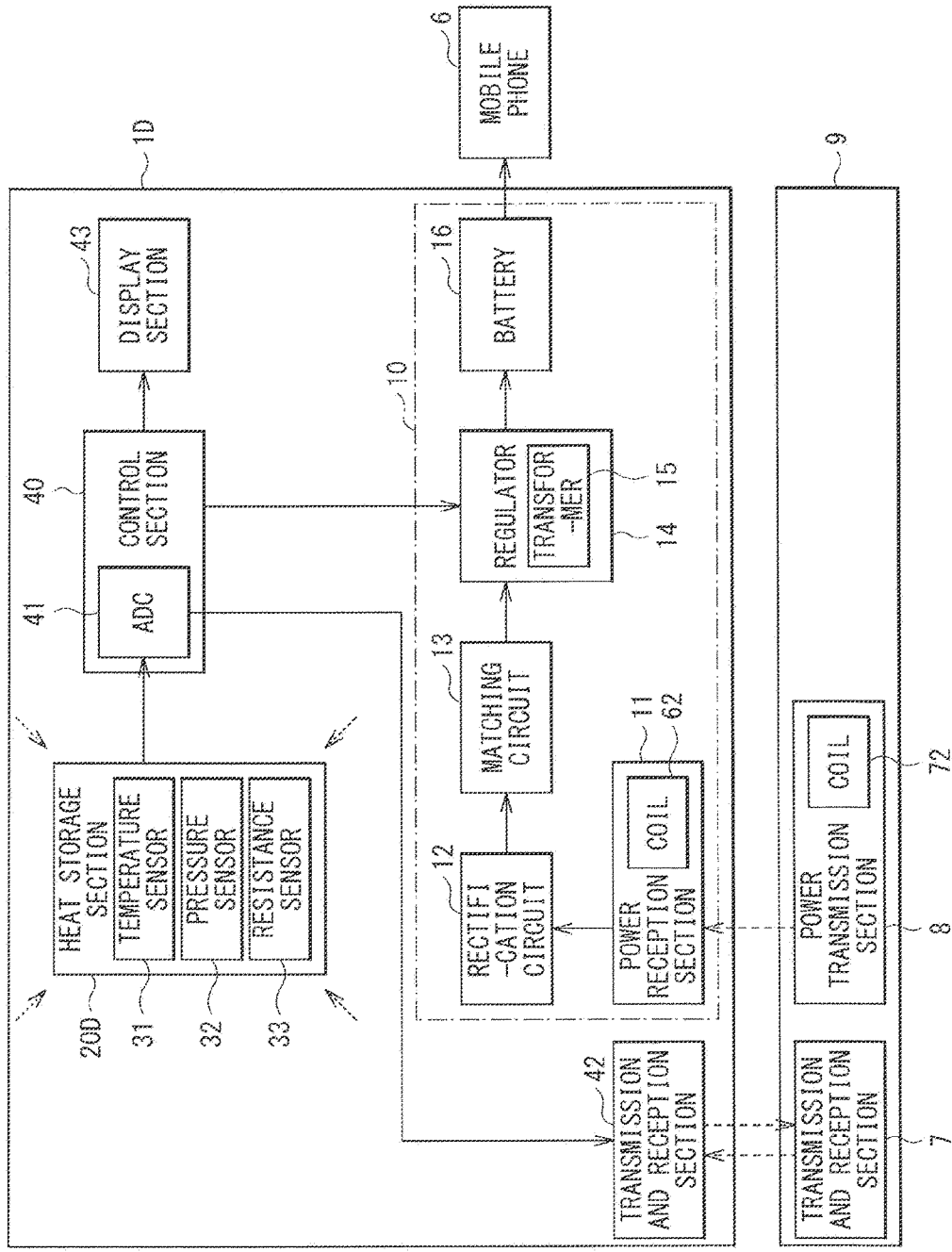
[FIG. 18]

[ FIG. 19 ]
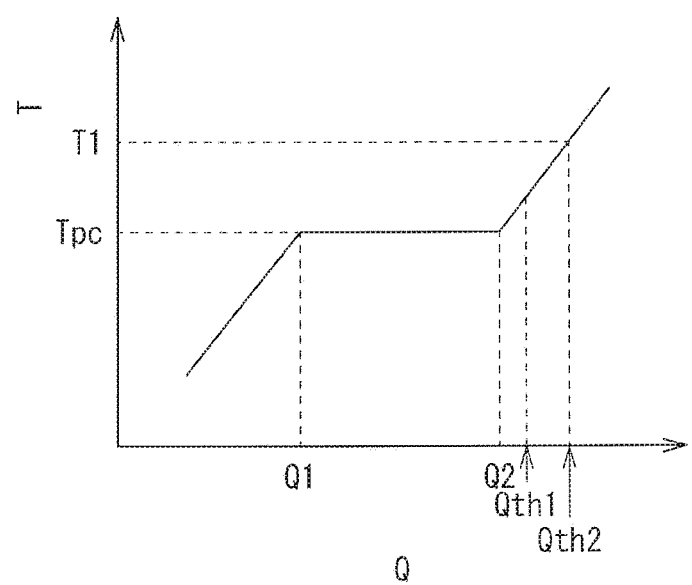

[ FIG. 20 ]
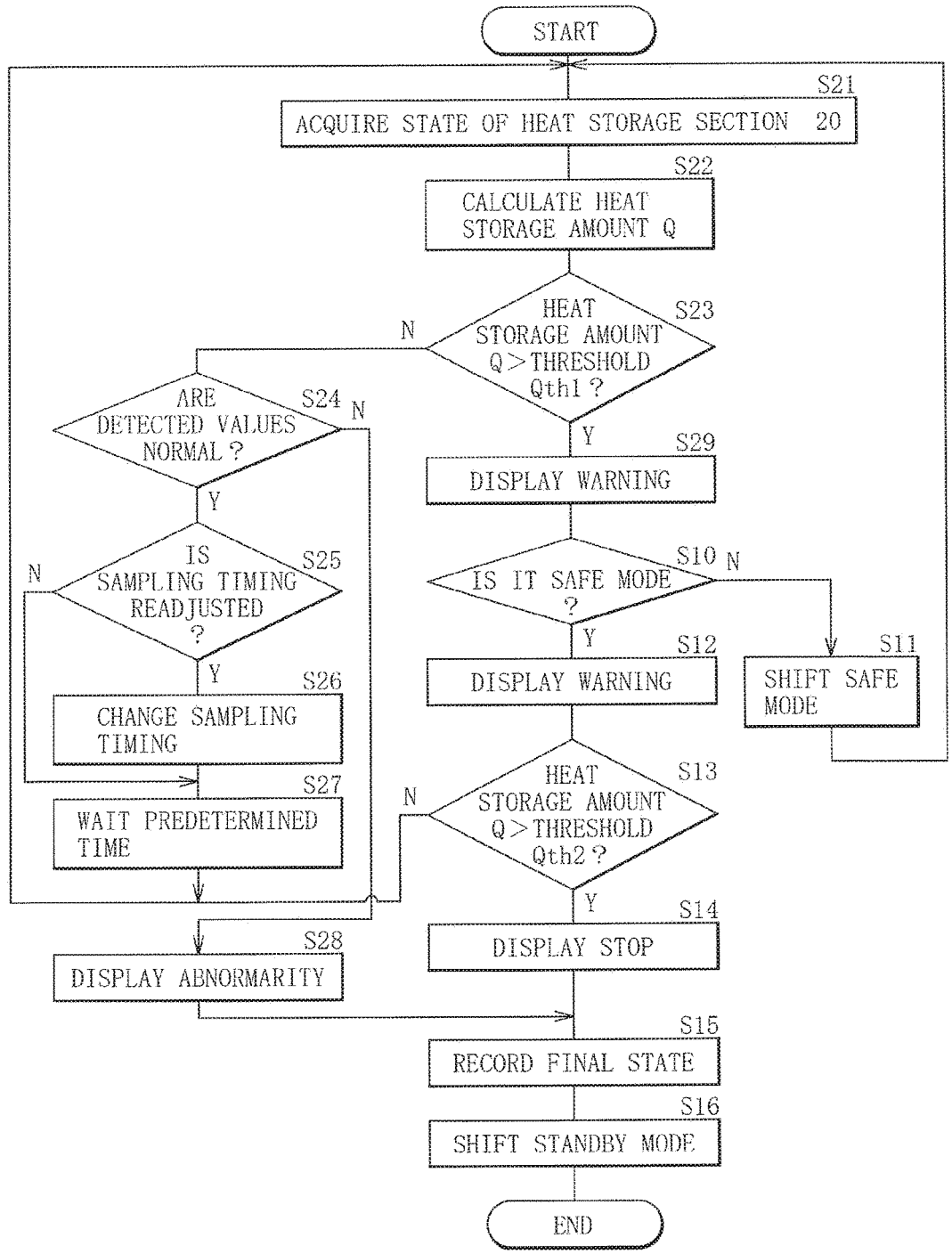

[FIG. 21]
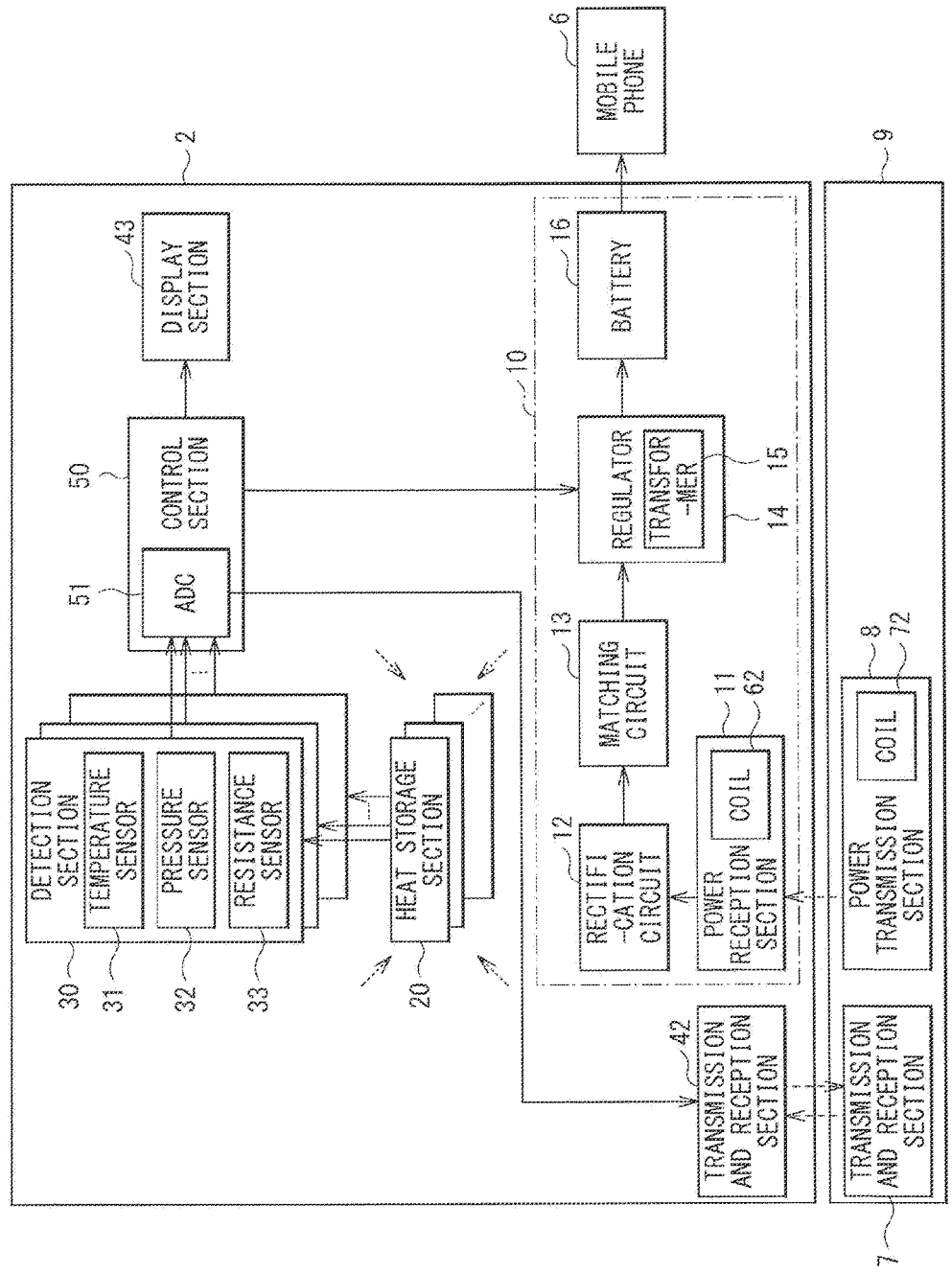

[ FIG. 22 ]
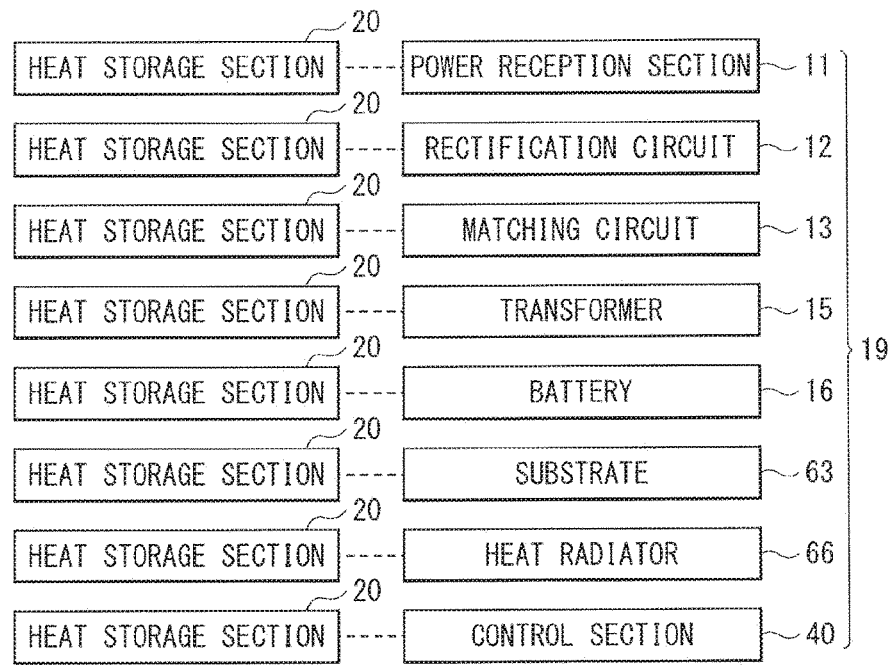
[ FIG. 23 ]
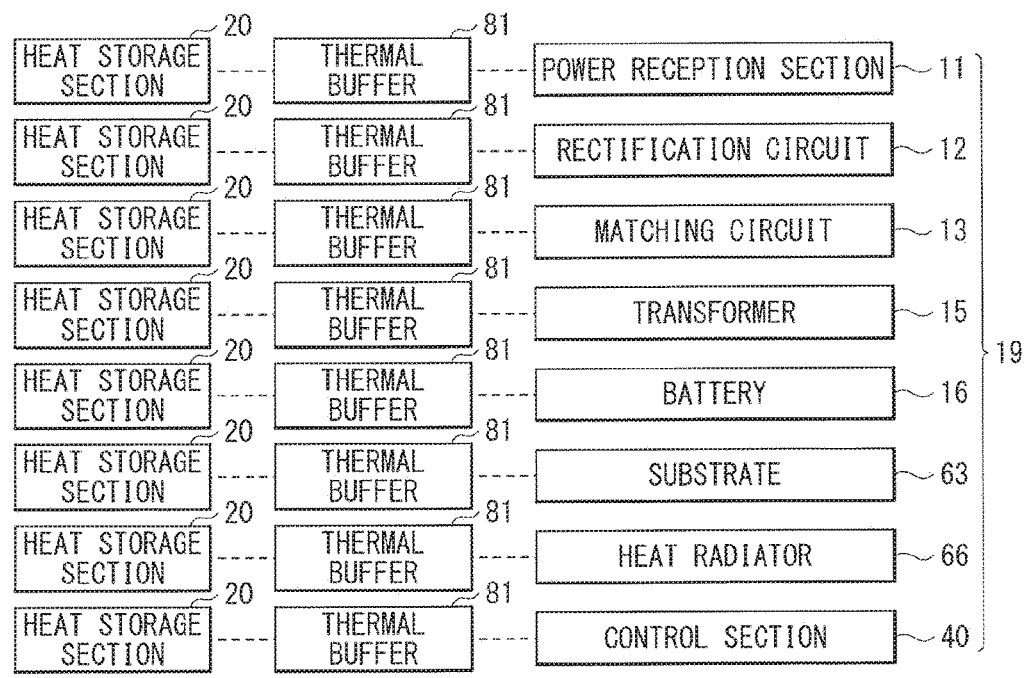

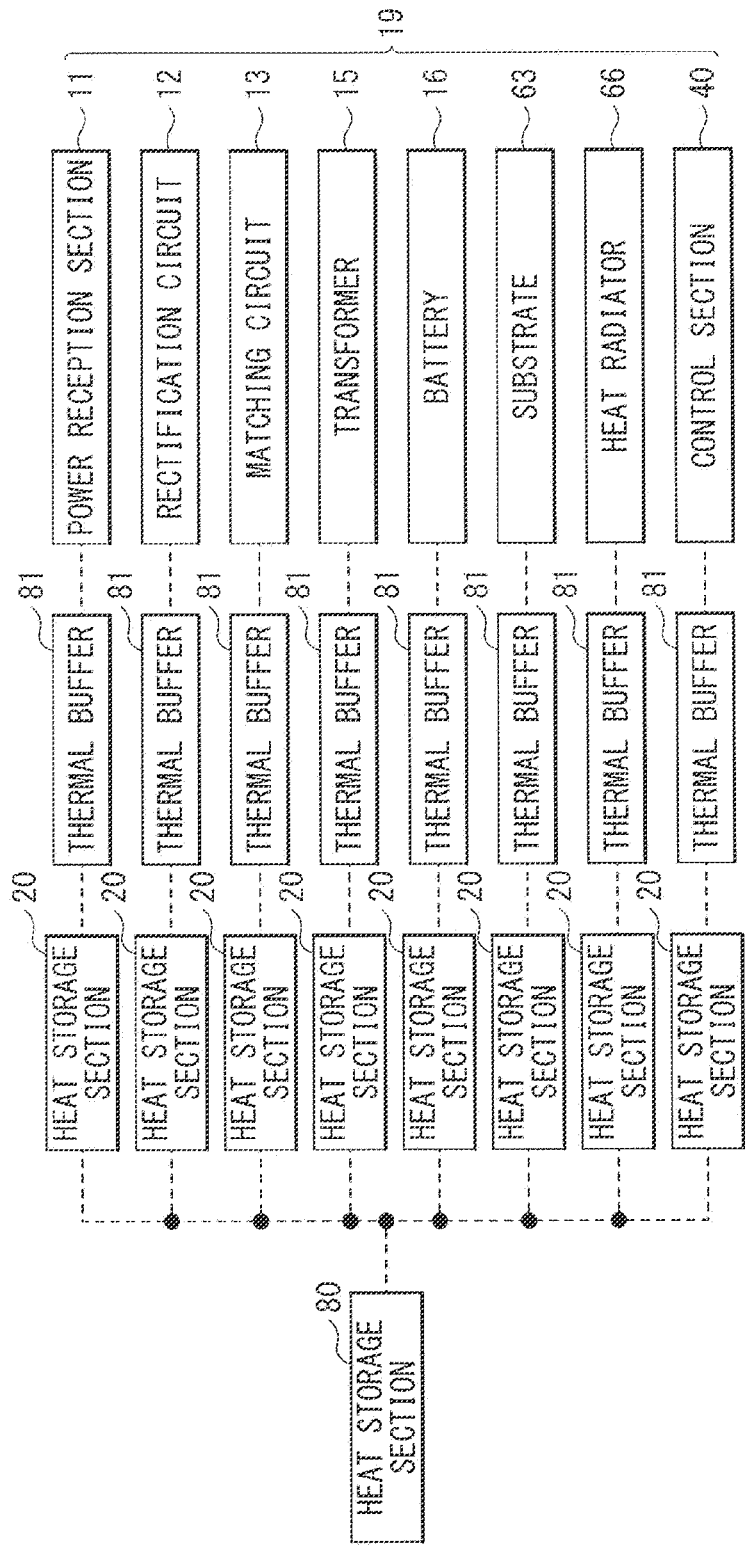
[FIG. 24]

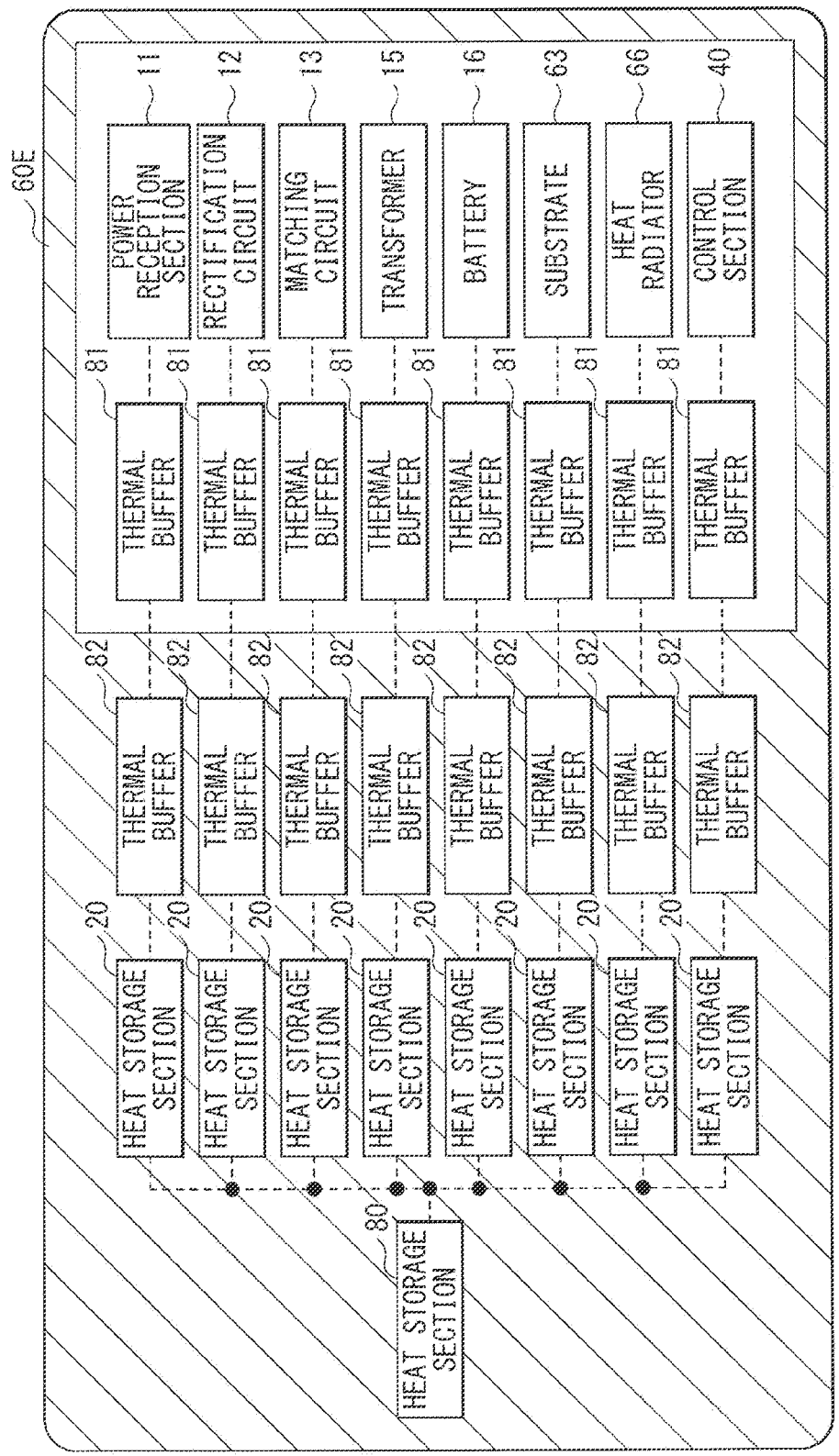
[FIG. 25]

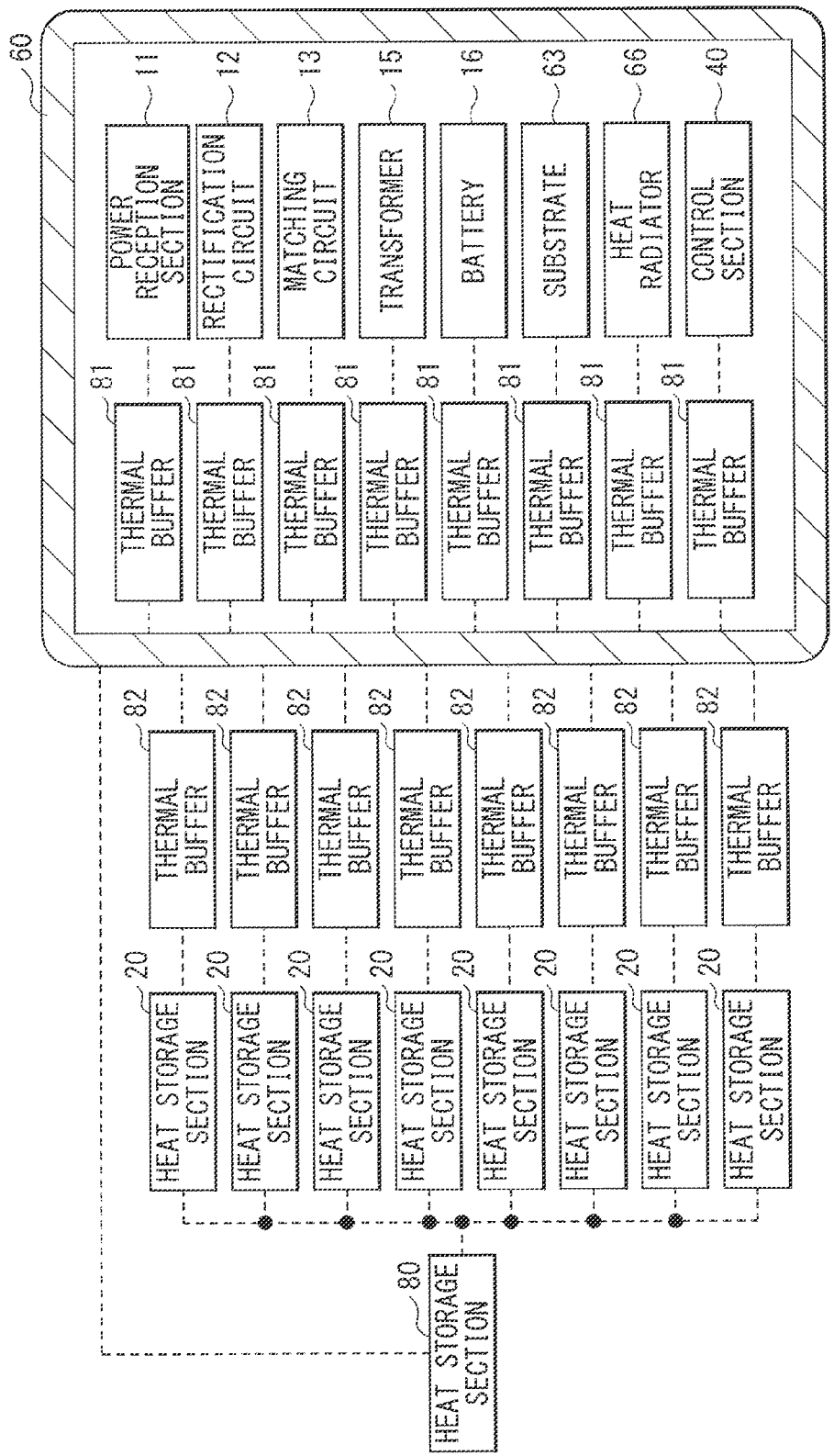
[FIG. 26]

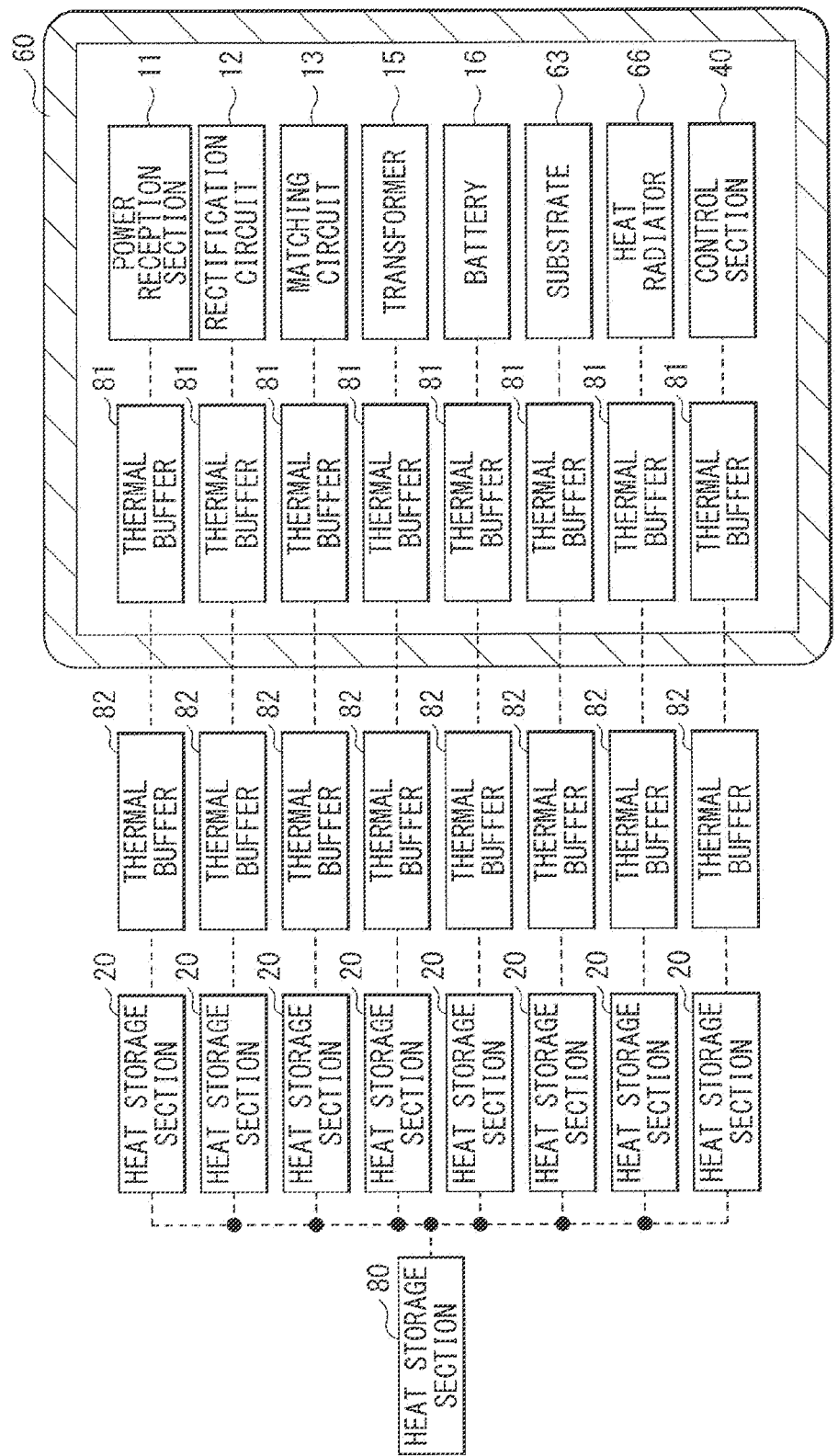
[FIG. 27]

[ FIG. 28A ]
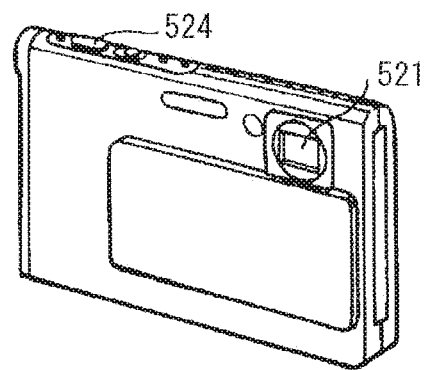
[ FIG. 28B ]
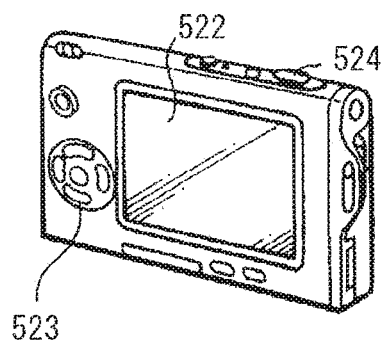

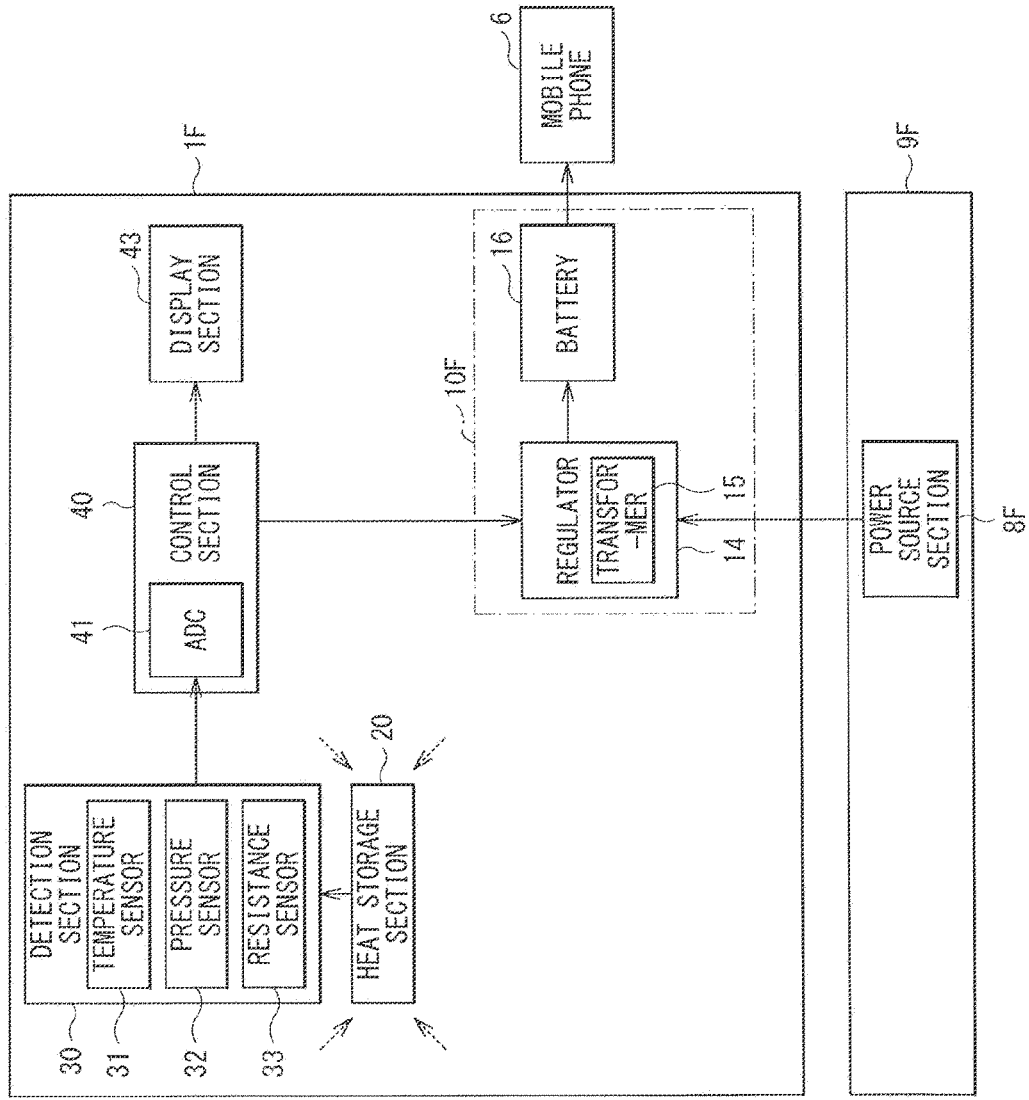
[FIG. 29]

[ FIG. 30 ]
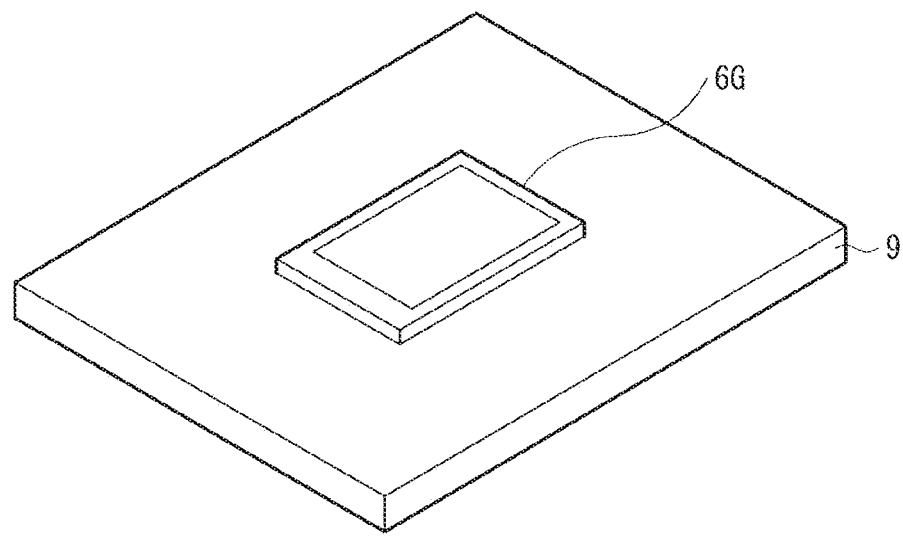
[ FIG. 31 ]
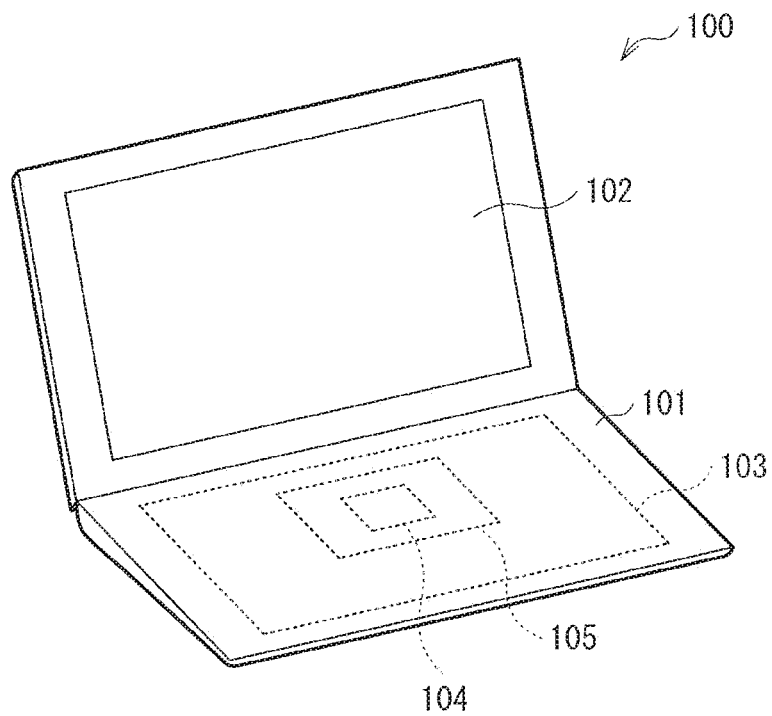

US 10,447,059 B2

ELECTRONIC APPARATUS, METHOD OF CONTROLLING ELECTRONIC APPARATUS, POWER RECEPTION DEVICE, ELECTRIC DEVICE, AND SYSTEM

CROSS REFERENCE TO RELATED APPLICATIONS

The present Application is a Continuation Application of U.S. patent application Ser. No.: 14/901,022 filed Dec. 27, 2015, which is a 371 National Stage Entry of International Application No.: PCT/JP2014/003326, filed on Jun. 20, 2014, which in turn claims priority from Japanese Priority Patent Application JP 2013-135055 filed Jun. 27, 2013, and Japanese Priority Patent Application JP 2013-243811 filed Nov. 26, 2013, the entire contents of which are incorporated herein by reference.

TECHNICAL FIELD

The present disclosure relates to an electronic apparatus, a method of controlling an electronic apparatus, a power reception device, an electric device, and a system.

BACKGROUND ART

Electronic components used in an electronic apparatus generate heat by power conduction. Therefore, in terms of operation stability and lifetime of the electronic components, it is important for the electronic apparatus to dissipate the generated heat to outside of its enclosure. In particular, in portable electronic apparatuses such as a mobile phone, a digital camera, and a portable music player, the enclosure is small and the surface area thereof is small, and thus it is desired to dissipate heat more efficiently.

Various techniques of the heat dissipation method for electronic apparatuses have been disclosed. For example, in PTL 1, a portable electronic apparatus that includes heating components, heat storage members, and heat dissipation members has been disclosed. The portable electric apparatus temporarily store the heat from the heating components in the heat storage members, and dissipates the stored heat from the heat dissipation members, to suppress temperature increase inside the enclosure.

CITATION LIST

Patent Literature

[PTL 1] Japanese Patent No. 4485458

SUMMARY

Technical Problem

As described above, it is generally desired for the electronic apparatus to suppress the temperature increase inside the enclosure during operation, and further suppression of the temperature increase is expected.

It is desirable to provide an electronic apparatus, a method of controlling an electronic apparatus, a power reception device, an electric device, and a system that are capable of suppressing temperature increase inside an enclosure.

Solution to Problem

According to an embodiment of the disclosure, there is provided an electronic apparatus including: a heating section; a heat storage section; a detection section configured to detect a heat storage amount of the heat storage section; and a control section configured to control operation of the heating section, based on the heat storage amount detected by the detection section.

According to an embodiment of the disclosure, there is provided a method of controlling an electronic apparatus. The method includes: detecting a heat storage amount of a heat storage section, the heat storage section being configured to store therein at least a part of heat generated from a heating section provided in an electronic apparatus; and controlling operation of the heating section, based on the detected heat storage amount.

According to an embodiment of the disclosure, there is provided a power reception device having a first side and a second side, including an electric device disposed along the first side; a contact member disposed along the second side; a substrate mounted on the contact member; and an electronic circuit disposed between the electric device and the substrate.

According to an embodiment of the disclosure, there is provided an electric device having a first side and a second side, including: a power reception device disposed along the first side; a contact member disposed along the second side; a substrate mounted on the contact member; and an electronic circuit disposed between the electric device and the substrate.

According to an embodiment of the disclosure, there is provided a system including: a power reception device including a first contact member and an electronic circuit; a first substrate mounted on the first contact member; and a power source device including a second contact member disposed on a second substrate. The first contact member is configured to face the second contact member when the power reception device and the power source device come into a contact.

In the electronic apparatus and the method of controlling the electronic apparatus according to the respective embodiments of the disclosure, the heat generated at the time when the heating section operates is stored in the heat storage section. At this time, the heat storage amount in the heat storage section is detected, and the operation of the heating section is controlled based on the detected heat storage amount.

In the power reception device according to the embodiment of the disclosure, the electric device is disposed along the first side, and the contact member is disposed along the second side. Further, the substrate is mounted on the contact member, and the electronic circuit is disposed between the electric device and the substrate.

In the electric device according to the embodiment of the disclosure, the power reception device is disposed along the first side, and the contact member is disposed along the second side. Further, the substrate is mounted on the contact member, and the electronic circuit is disposed between the electric device and the substrate.

In the system according to the embodiment of the disclosure, the first contact member is provided in the power reception device, and the second contact member is disposed on the second substrate of the power source device. Further, when the power reception device and the power source device come into a contact, the first contact member and the second contact member are allowed to face each other.

Advantageous Effects of Invention

According to the electronic apparatus and the method of controlling the electronic apparatus according to the respective embodiments of the disclosure, the heat storage amount of the heat storage section is detected, and the operation of the heat storage section is controlled based on the detected heat storage amount. Therefore, it is possible to suppress temperature increase inside the enclosure.

According to the power reception device, the electric device, and the system according to the respective embodiments of the disclosure, the contact member, the substrate, and the electronic circuit are provided and the substrate is mounted on the contact member. Therefore, it is possible to suppress temperature increase inside the enclosure.

It is to be understood that both the foregoing general description and the following detailed description are exemplary, and are provided to provide further explanation of the technology as claimed.

BRIEF DESCRIPTION OF DRAWINGS

The accompanying drawings are included to provide a further understanding of the technology, and are incorporated in and constitute a part of this specification. The drawings illustrate embodiments and, together with the specification, serve to explain the principles of the technology.

FIG. 1 is a block diagram illustrating a configuration example of a power source device according to a first embodiment of the disclosure.

FIG. 2 is a perspective view illustrating a usage example of the power source device illustrated in FIG. 1.

FIG. 3 is a characteristic diagram illustrating a characteristic example of a heat storage section illustrated in FIG. 1.

FIG. 4A is a sectional diagram illustrating a schematic sectional structure of the power source device and a feeding device illustrated in FIG. 1.

FIG. 4B is a sectional diagram illustrating a schematic sectional structure of another power source and the feeding device.

FIG. 5 is an explanatory diagram illustrating thermal connection of the heat storage section in the power source device illustrated in FIG. 1.

FIG. 6 is a flowchart illustrating an operation example of the power source device illustrated in FIG. 1.

FIG. 7 is a characteristic diagram illustrating a characteristic example of the heat storage section.

FIG. 8 is another characteristic diagram illustrating a characteristic example of the heat storage section.

FIG. 9A is a sectional diagram for explaining thermal connection.

FIG. 9B is a sectional diagram for explaining thermal connection according to a modification of the first embodiment.

FIG. 9C is a sectional diagram for explaining thermal connection according to another modification of the first embodiment.

FIG. 9D is a sectional diagram for explaining the thermal connection according to still another modification of the first embodiment.

FIG. 10 is a perspective view illustrating a configuration example of a heat storage section according to still another modification of the first embodiment.

FIG. 11 is an explanatory diagram illustrating thermal connection of a heat storage section according to still another modification of the first embodiment.

FIG. 12 is an explanatory diagram illustrating thermal connection of a heat storage section according to still another modification of the first embodiment.

FIG. 13 is an explanatory diagram illustrating thermal connection of a heat storage section according to still another modification of the first embodiment.

FIG. 14 is an explanatory diagram illustrating thermal connection of a heat storage section according to still another modification of the first embodiment.

FIG. 15 is an explanatory diagram illustrating thermal connection of a heat storage section according to still another modification of the first embodiment.

FIG. 16 is an explanatory diagram illustrating thermal connection of a heat storage section according to still another modification of the first embodiment.

FIG. 17 is a block diagram illustrating a configuration example of a power source device according to still another modification of the first embodiment.

FIG. 18 is a block diagram illustrating a configuration example of a power source device according to still another modification of the first embodiment.

FIG. 19 is an explanatory diagram illustrating a setting example of a threshold according to still another modification of the first embodiment.

FIG. 20 is a flowchart illustrating an operation example of a power source device according to a still another modification of the first embodiment.

FIG. 21 is a block diagram illustrating a configuration example of a power source device according to a second embodiment.

FIG. 22 is an explanatory diagram illustrating thermal connection of a heat storage section in the power source device illustrated in FIG. 21.

FIG. 23 is an explanatory diagram illustrating thermal connection of a heat storage section according to a modification of the second embodiment.

FIG. 24 is an explanatory diagram illustrating thermal connection of a heat storage section according to still another modification of the second embodiment.

FIG. 25 is an explanatory diagram illustrating thermal connection of a heat storage section according to still another modification of the second embodiment.

FIG. 26 is an explanatory diagram illustrating thermal connection of a heat storage section according to still another modification of the second embodiment.

FIG. 27 is an explanatory diagram illustrating thermal connection of a heat storage section according to still another modification of the second embodiment.

FIG. 28A is a perspective view illustrating an appearance configuration of a digital camera to which the power source device according to any of the embodiments is applied.

FIG. 28B is another perspective view illustrating the appearance configuration of the digital camera to which the power source device according to any of the embodiments is applied.

FIG. 29 is a block diagram illustrating a configuration example of a power source device according to a modification.

FIG. 30 is a perspective view illustrating an application example of the power source device according to any of the embodiments to a mobile phone.

FIG. 31 is an explanatory diagram illustrating an application example of the heat storage section according to any of the embodiments to a personal computer.

DESCRIPTION OF EMBODIMENTS

Hereinafter, some embodiments of the present disclosure will be described in detail with reference to drawings. Note that description will be given in the following order.

1. First Embodiment
2. Second Embodiment
3. Application Examples

<1. First Embodiment>
(Configuration Example)
(Overall Configuration Example)

FIG. 1 illustrates a configuration example of a power source device 1 according to a first embodiment. The power source device 1 is a power source device that receives supply of power from a feeding device through a wireless system, and charges a battery based on the power. Note that an electronic apparatus and a method of controlling an electronic apparatus according to embodiments of the disclosure are embodied by the present embodiment, and thus are described together. The power source device 1 includes a power source section 10, a heat storage section 20, a detection section 30, a control section 40, a transmission and reception section 42, and a display section 43.

FIG. 2 illustrates a usage example of the power source device 1. As illustrated in FIG. 2, the power source device 1 receives power from a tray feeding device 9 by being placed on the feeding device 9 without being connected through a connector or the like. Specifically, in this example, the power source device 1 receives power from the feeding device 9 through electromagnetic induction. In this example, the power source device 1 is a so-called jacket-type power source device used by being mounted on a mobile phone 6.

As illustrated in FIG. 1, the power source section 10 includes a power reception section 11, a rectification circuit 12, a matching circuit 13, a regulator 14, and a battery 16. The power source section 10 charges the battery 16 based on the power supplied from the feeding device 9.

The power reception section 11 receives power from a power transmission section 8 of the feeding device 9. Specifically, the power reception section 11 includes a coil 62 (described later) and a magnetic core, and receives power as an AC signal through electromagnetic induction from the power transmission section 8 that similarly includes a coil 72 (described later) and a magnetic core.

The rectification circuit 12 rectifies the AC signal received by the power reception section 11. Specifically, the rectification circuit 12 may include a diode, for example, and rectifies the AC signal received by the power reception section 11 by rectification operation of the diode.

The matching circuit 13 adjusts the power supplied from the rectification circuit 12 to power suitable for operation of the regulator 14. Specifically, the matching circuit 13 includes a load circuit (not illustrated). For example, when the power supplied from the rectification circuit 12 is excessively large, the matching circuit 13 allows the load circuit to consume a part of the power to adjust the power, and supplies the adjusted power to the regulator 14. This prevents the regulator 14 from being supplied with excessive power in the power source device 1. Specifically, for example, depending on the contact condition between the feeding device 9 and the power source device 1, the coupling of the electromagnetic induction may be large, and a larger amount of power may be supplied from the feeding device 9 to the power source device 1. The power source device 1 has the matching circuit 13 to adjust the power in order to operate more stably in such a case.

Note that, in this example, the matching circuit 13 is provided between the rectification circuit 12 and the regulator 14, however this is not limitative. Alternatively, for example, the matching circuit 13 may be provided between the power reception section 11 and the rectification circuit 12, may be provided in the regulator 14, or may be provided between the regulator 14 and the battery 16.

The regulator 14 steps down the voltage supplied from the matching circuit 13, and generates a voltage suitable for charging of the battery 16. The regulator 14 has a transformer 15. For example, the transformer 15 is a so-called piezoelectric transformer configured of a piezoelectric ceramic. The regulator 14 performs switching operation to step down the voltage supplied from the matching circuit 13, and supplies the power to the battery 16. In addition, as will be described later, in the case where the regulator 14 is instructed to operate in a safe mode by the control section 40, the regulator 14 controls the switching operation to decrease the power supplied to the battery 16.

The battery 16 stores therein the power supplied from the regulator 14, and for example, may be configured using a rechargeable battery (a secondary battery) such as a lithium ion battery. Mounting the power source device 1 on the mobile phone 6 (in this example, a smartphone) causes the battery 16 to be connected to the mobile phone 6, and the battery 16 supplies the power to the mobile phone 6.

As will be described later, the heat storage section 20 is thermally connected to various components in the power source device 1 by a thermal conduction sheet and the like, and stores therein heat generated from the components. In this example, the heat storage section 20 is configured using an electronic phase transition heat storage material. The electronic phase transition heat storage material causes metal insulator transition, and examples thereof may include, for example, $VO_2$, a vanadium oxide that is $VO_2$ doped with any of W, Re, Mo, Ru, Nb, Ta, etc., and a material containing any of $LiMn_2O_4$, $LiVS_2$, $LiVO_2$, $NaNiO_2$, $ReBaFe_2O_5$, $REBaCo_2O_{5.5}$ (where RE is a rare earth element such as Y, Sm, Pr, Eu, Gd, Dy, Ho, and Tb). In addition, for example, a mixture of two or more thereof may be used, or a mixture in which one or more materials thereof is used as a main component and other accessory components are added thereto may be used. The electronic phase transition heat storage material is not limited thereto, and other materials may be used.

Incidentally, in this example, the heat storage section 20 is configured using the electronic phase transition heat storage material. However, the heat storage section 20 may be configured using a material that performs phase transition in a solid state (a solid phase transition heat storage material), without limitation. Examples of such a solid phase transition heat storage material may include, for example, materials that cause martensitic transformation (a shape-memory alloy such as NiTi, CuZnAl, and CuAlNi), thermochromic materials (such as N,N-diethylethylenediamine copper complex), plastic crystals (such as trimethylolethane, pentaerythritol, and neopentylglycol), magnetic phase transition substances (such as Mn—Zn ferrite and NiFe alloy), paraelectrics-ferroelectrics transition substances (such as $BaTiO_3$), and other solid-solid structural phase transition materials.

In addition, for example, the heat storage section 20 may be configured using a latent heat storage material. Examples of the latent heat storage material may include, for example, organic materials, inorganic hydrated salt materials, and low-melt metallic materials.

Examples of the organic latent heat storage material may include, for example, paraffins (such as n-nodecane, n-icosane, n-henicosane, n-docosane, n-tricosane, n-tetracosane, n-pentacosane, n-hexacosane, n-heptacosane, n-octacosane, n-nonacosane, n-triacontane, n-hentriacontane, n-dotriacontane, n-tritriacontane, and paraffin wax), fatty acids or fatty acid esters (such as capric acid, undecylic acid, lauric acid, tridecylic acid, myristic acid, pentadecylic acid, palmitic acid, margaric acid, stearic acid, nonadecylic acid, arachidic acid, heneicosylic acid, behenic acid, lignoceric acid, triacontanoic acid, hydroxystearic acid, sebacic acid, crotonic acid, elaidic acid, erucic acid, nervonic acid, fatty acid esters (including esters of the above-described fatty acids)), and sugar alcohol (such as xylitol, erythritol, mannitol, sorbitol, galactitol, and threitol). Moreover, polyethylene, tetradecanol, dodecanol, polyglycol, naphthalene, propionamide, acetamide, biphenyl, dimethyl sulfoxide, trimethylolethane hydrate, side chain crystalline polymer, organic metal complex may be used in addition thereto. Moreover, a mixture or a eutectic crystal of two or more of these organic materials may be used, or a mixture in which one or more thereof is used as a main component and other accessory components (benzoic acid, urea, water, or the like) are added thereto may be used.

Examples of the inorganic hydrated salt latent heat storage material may include, for example, sodium acetate hydrate, potassium acetate hydrate, sodium hydroxide hydrate, potassium hydroxide hydrate, strontium hydroxide hydrate, barium hydroxide hydrate, sodium chloride hydrate, magnesium chloride hydrate, potassium chloride hydrate, calcium chloride hydrate, zinc chloride hydrate, lithium nitrate hydrate, magnesium nitrate hydrate, calcium nitrate hydrate, aluminum nitrate hydrate, cadmium nitrate, iron nitrate hydrate, zinc nitrate hydrate, manganese nitrate hydrate, lithium sulfate hydrate, sodium sulfate hydrate, magnesium sulfate hydrate, calcium sulfate hydrate, potassium aluminum sulfate hydrate, aluminum ammonium sulfate hydrate, sodium thiosulfate hydrate, potassium phosphate hydrate, sodium phosphate hydrate, potassium hydrogenphosphate hydrate, sodium hydrogenphosphate hydrate, sodium borate hydrate, calcium bromide hydrate, potassium fluoride hydrate, and sodium carbonate hydrate. Moreover, a mixture or an eutectic crystal of two or more of these inorganic hydrated salt materials, or a mixture in which one or more thereof is used as a main component and other accessory components (benzoic acid, ammonium salt, water, or the like) are added may be used.

Examples of the low-melt metallic latent heat storage material may include, for example, gallium, bismuth/lead/indium alloy (for example, Bi: 52%, Pb: 26%, and In: 22%), bismuth/lead/tin alloy (for example, Bi: 52%, Pb: 32%, and Sn: 16%), bismuth/lead alloy (for example, Bi: 56% and Pb: 45%), bismuth/indium/tin alloy (for example, Bi: 58%, In: 25%, and Sn: 17%), and wood metal (for example, Bi: 50%, Pb: 26.7%, Sn: 13.3%, and Cd: 10%). Moreover, a mixture of two or more of these low-melt metallic materials, or a mixture in which one or more thereof is used as a main component and other accessory components are added thereto may be used.

Hereinbefore, although examples of the latent heat storage material are described, other latent heat storage materials may be used without limitation.

Since these latent heat storage materials are changed in phase to a liquid at a melting point or larger, for example, the latent heat storage materials may be desirably contained in a container formed of a metal or a resin. Moreover, for example, the latent heat storage materials may be contained in a microcapsule to be handled as a solid. This suppresses possibility of leakage of the material into the power source device 1 even when the material is changed in phase from a solid to a liquid.

FIG. 3 illustrates characteristics of the heat storage section 20. A horizontal axis in FIG. 3 indicates a heat storage amount Q of the heat storage section 20, and a vertical axis indicates a temperature T of the heat storage section 20. In this example, when the heat storage amount Q is sufficiently low (Q<Q1), the temperature T of the heat storage section 20 is increased as the heat storage amount Q is increased. When the heat storage amount Q is larger than a heat storage amount Q1, the temperature T is substantially constant (transition temperature Tpc) even if the heat storage amount Q is changed. At this time, electronic phase transition occurs in the heat storage section 20, and for example, the electric resistance value, the volume, and the like of the heat storage section 20 are changed. Specifically, in the heat storage section 20, even when the temperature T is within a substantially constant range, the electric resistance value R is decreased as the heat storage amount Q is increased. Note that, in the case where the heat storage section 20 is formed of the latent heat storage material, the volume thereof is changed even when the temperature T is within the substantially constant range. Then, when the heat storage amount Q is larger than a heat storage amount Q2, the temperature T is again increased as the heat storage amount Q is increased.

The characteristics allows the heat storage section 20 to store therein heat of, for example, about the heat storage amount Q2 while suppressing increase in the temperature. As a result, in the power source device 1, the heat storage section 20 stores therein heat generated when the battery 16 is charged, which suppresses temperature increase in the enclosure.

In other words, the power source device 1 is capable of increasing capacity with respect to the inflow heat amount (maximum inflow heat amount) per unit of time by including the heat storage section 20. Specifically, heat generation in the power source device 1 at the time when the power is supplied from the feeding device 9 and the battery 16 is charged is equivalent to inflow of heat amount from the feeding device 9. The power source device 1 is provided with the heat storage section 20, and thus the temperature increase is allowed to be suppressed even when a large amount of heat is flowed in the power source device 1 from the feeding device 9. As a result, it is possible to increase the maximum inflow heat amount. Since the power source device 1 is capable of increasing the maximum inflow heat amount in this way, the power source device 1 is capable of receiving the large amount of power from the feeding device 9 and charging the battery 16 with the large amount of power. In other words, in the power source device 1, it is possible to increase the power supply amount to the battery 16 per unit of time. As a result, in the power source device 1, it is possible to charge the battery 16 in a shorter time.

The detection section 30 detects a state of the heat storage section 20. In this example, the detection section 30 includes a temperature sensor 31, a pressure sensor 32, and a resistance sensor 33. The temperature sensor 31 detects the temperature T of the heat storage section 20, and for example, a thermocouple sensor, a pyroelectric sensor, a bimetal, a resistance variation type sensor may be used as the temperature sensor 31. The temperature sensor 31 may be provided on a surface of the heat storage section 20, or may be provided at a position slightly distant from the heat storage section 20. The temperature sensor 31 is difficult to acquire the temperature of the heat storage section 20 as being distanced from the heat storage section 20. Therefore, when the temperature sensor 31 is provided at a position distanced from the heat storage section 20, the temperature sensor 31 is desirably provided at a position where the temperature of the heat storage section 20 is estimated with accuracy of a certain level, based on the temperature detected by the temperature sensor 31. The pressure sensor 32 detects pressure P of the heat storage section 20 (namely, volume, stress, strain of the heat storage section 20). Incidentally, the pressure sensor 32 is used in this example, however, alternatively or together therewith, a strain gauge that detects the strain of the heat storage section 20 may be used. The resistance sensor 33 detects the electric resistance value R of the heat storage section 20.

The control section 40 controls operation of the power source section 10, based on the detected values (the temperature T, the pressure P, and the electric resistance value R) for the heat storage section 20 that are detected by the detection section 30. The control section 40 includes an analog to digital converter (ADC) 41. The ADC 41 converts the detected values that are analog values supplied from the detection section 30, into digital values. Further, the control section 40 controls the operation of the regulator 14 and the feeding operation of the feeding device 9, based on the detected values converted into the digital values, to control charging of the battery 16. Note that the configuration is not limited thereto, and alternatively, for example, the control section 40 may be configured of only an analog circuit, and may control the charging of the battery 16 based on analog values.

At this time, as will be described later, the control section 40 determines the heat storage amount Q of the heat storage section 20 based on the detected temperature T, the detected pressure P, and the detected electric resistance value R, and controls the operation of the regulator 14 and the feeding operation of the feeding device 9 based on the heat storage amount Q. Specifically, as will be described later, the control section 40 compares the heat storage amount Q with two thresholds Qth1 and Qth2, and controls the operation based on the comparison result. For example, the thresholds Qth1 and Qth2 are set as follows.

$$Qth1=(Q2-Q1)*Ks+Q1$$

$$Qth2=Q2$$

where a parameter Ks is a safety factor, and may be set to, for example, about "0.8". In this example, as illustrated in FIG. 3, the threshold Qth1 is set to a value between the heat storage amount Q1 and the heat storage amount Q2, and the threshold Qth2 is set to the heat storage amount Q2. When the heat storage section 20 stores therein heat and the heat storage amount Q exceeds the threshold Qth1, the control section 40 sets the operation mode to a safe mode, and when the heat storage amount Q exceeds the threshold Qth2, the control section 40 sets the operation mode to a standby mode.

In this way, the control section 40 controls the operation of the regulator 14 and the feeding operation of the feeding device 9, to control the charging of the battery 16. In addition, the control section 40 also has a function of instructing display operation to the display section 43.

The transmission and reception section 42 performs communication with a transmission and reception section 7 of the feeding device 9. This allows the control section 40 of the power source device 1 to control the operation of the feeding device 9. Specifically, for example, as will be described later, when the control section 40 sets the operation mode to the safe mode, the transmission and reception section 42 transmits such status to the transmission and reception section 7 of the feeding device 9, and the feeding device 9 decreases the power supplied to the power source device 1. As a method of decreasing the power supplied to the power source device 1, for example, a current flowing through the coil 72 (described later) of the power transmission section 8 may be decreased, or a duty ratio of the PWM control may be decreased. In addition, coupling between the power transmission section 8 and the power reception section 11 may be decreased. More specifically, for example, the frequency of the electromagnetic induction may be changed, the position of the coil 72 in the feeding device 9 may be moved, or operation of covering the coil 72 with a physical barrier such as an electromagnetic shield may be performed.

Moreover, for example, as will be described later, when the control section 40 sets the operation mode to the standby mode, the transmission and reception section 42 transmits such status to the transmission and reception section 7 of the feeding device 9, and the feeding device 9 stops power feeding to the power source device 1.

Incidentally, as illustrated in FIG. 1, the transmission and reception section 42 may be a single block, or may be configured to perform transmission and reception with use of, for example, a coil 62 of the power reception section 11. Likewise, for example, in the feeding device 9, the transmission and reception section 7 may be a single block, or may be configured to perform transmission and reception with use of, for example, the coil 72 of the power transmission section 8.

The display section 43 informs user of the operation state of the power source device 1 based on the instruction from the control section 40. More specifically, as will be described later, the display section 43 may display, for example, various kinds of warnings, a residual capacity of the heat amount stored in the heat storage section 20 (heat storage capacity), etc.

(Thermal Connection)

Next, thermal connection between various components in the power source device 1 will be described.

FIG. 4A illustrates a schematic sectional structure of the feeding device 9 and the power source device 1 placed thereon. In FIG. 4A, the mobile phone 6 is mounted on the power source device 1.

The power source device 1 includes, in an enclosure 60, a substrate 63, an electronic circuit 64, the transformer 15, the coil 62, the battery 16, the heat storage section 20, a heat conduction section 61, and a connector 65. The substrate 63 is a printed circuit board (PCB) substrate, and the electronic circuit 64 and the transformer 15 are mounted on the surface of the substrate 63. The electronic circuit 64 is configured of an integrated circuit and individual components, and corresponds to the rectification circuit 12, the matching circuit 13, the regulator 14 (except for the transformer 15), the control section 40, and the like that are illustrated in FIG. 1. The coil 62 is disposed on a bottom surface side (a surface in contact with the feeding device 9) of the power source device 1. Therefore, the coil 62 faces the coil 72 of the feeding device 9. In this example, the heat storage section 20 is provided so as to be in contact with the battery 16, the electronic circuit 64, and the transformer 15. The connector 65 connects the mobile phone 6 to the battery 16, the electronic circuit 64, and the like of the power source device 1. The heat conduction section 61 is provided between these components and the enclosure 60. The heat conduction section 61 transfers the heat generated in these components to the enclosure 60.

The feeding device 9 includes, in an enclosure 70, a substrate 73, the coil 72, and a heat conduction section 71. The substrate 73 is a PCB substrate, and an electronic circuit to control power transmission to the power source device 1 is mounted on a surface of the substrate 73. The coil 72 corresponds to the power reception section 90 illustrated in FIG. 1, and is disposed on a top surface side (a surface in contact with the power source device 1) of the feeding device 9. The heat conduction section 71 is provided between the substrate 73 and the enclosure 70. The heat conduction section 71 transfers the heat generated by the coil, the electronic circuit mounted on the substrate 73, or the like, to the enclosure 70.

When the battery 16 is charged with the power supplied from the feeding device 9, heat is generated in the power source device 1. The heat is dissipated to circumference, or is stored in the heat storage section 20. The heat stored in the heat storage section 20 is dissipated to circumference at a long time constant (for example, about several tens of minutes) when the power source section 10 does not operate, or the like. This heat dissipation may be performed by, for example, convective heat transfer of air, radiation to circumference, heat conduction to the mobile phone 6 or the feeding device 9, etc.

FIG. 4B illustrates a schematic sectional structure of the power source device 1 placed on the feeding device 9. In FIG. 4B, the mobile phone 6 is equipped with the power source device 1. The mobile phone 6 is connected to the feeding device 9 through the coil 62 in the mobile phone 6 and the coil 72 in the feeding device.

The power source device 1 includes, in an enclosure 60, a substrate 63, an electronic circuit 64, the transformer 15, the coil 62, the battery 16, the heat storage section 20, a heat conduction section 61 and a connector 65 to connect a processor of the mobile phone 6 as not shown in the FIG. 4B. The substrate 63 is a printed circuit board (PCB) substrate, and the electronic circuit 64 and the transformer 15 are mounted on the surface of the substrate 63 similar to those illustrated in FIG. 4A. The electronic circuit 64 is configured of an integrated circuit and individual components, and corresponds to the rectification circuit 12, the matching circuit 13, the regulator 14 (except for the transformer 15), the control section 40, and the like that are illustrated in FIG. 1. The coil 62 is disposed on a bottom surface side (a surface in contact with the feeding device 9) of the power source device 1. Therefore, the coil 62 faces the coil 72 of the feeding device 9. In this example, the heat storage section 20 is provided so as to be in contact with the battery 16, the electronic circuit 64, and the transformer 15. The connector 65 connects the mobile phone 6 to the battery 16, the electronic circuit 64, and the like of the power source device 1. The heat conduction section 61 is provided between these components and the enclosure 60. The heat conduction section 61 transfers the heat generated in these components to the enclosure 60.

The feeding device 9 includes, in an enclosure 70, a substrate 73, the coil 72, and a heat conduction section 71. The substrate 73 is a PCB substrate, and an electronic circuit to control power transmission to the power source device 1 is mounted on a surface of the substrate 73. The coil 72 corresponds to the power reception section 90 illustrated in FIG. 1, and is disposed on a top surface side (a surface in contact with the power source device 1) of the feeding device 9. The heat conduction section 71 is provided between the substrate 73 and the enclosure 70. The heat conduction section 71 transfers the heat generated by the coil, the electronic circuit mounted on the substrate 73, or the like, to the enclosure 70.

When the battery 16 is charged with the power supplied from the feeding device 9, heat is generated in the power source device 1. The heat is dissipated to circumference, or is stored in the heat storage section 20. The heat stored in the heat storage section 20 is dissipated to circumference at a long time constant (for example, about several tens of minutes) when the power source section 10 does not operate, or the like. This heat dissipation may be performed by, for example, convective heat transfer of air, radiation to circumference, heat conduction to the mobile phone 6 or the feeding device 9, etc.

FIG. 5 illustrates thermal connection in the power source device 1. In this example, the heat storage section 20 is thermally connected to each of the power reception section 11, the rectification section 12, the matching circuit 13, the transformer 15, the battery 16, the substrate 63, and the control section 40. In addition, although not illustrated, a heat radiator 66 such as a radiation fin and a fan is provided in the power source device 1, and the heat storage section 20 is also thermally connected to the heat radiator 66. The thermal connection is established by the heat conduction sheet and the like. Incidentally, the heat storage section 20 is connected to these eight components in this example. However, for example, it is only necessary for the heat storage section 20 to be connected to one or more of the components, and the heat storage section 20 may be connected to other components without limitation. In other words, the components thermally connected to the heat storage section 20 may be any component as long as the component generates heat (hereinafter, referred to as a heating component 19), and any number of heating components 19 may be connected to the heat storage section 20.

With this configuration, in the power source device 1, the heat generated in the respective components at the time when the battery 16 is charged is transferred to the heat storage section 20, and the heat storage section 20 stores therein the heat. Then, the heat stored in the heat storage section 20 is dissipated when the power source section 10 does not operate. As a result, the power source device 1 is allowed to increase capacity with respect to the inflow heat amount (maximum inflow heat amount) per unit of time, and to increase power supply amount to the battery 16 per unit of time. Consequently, it is possible to charge the battery 16 in a shorter time.

The power reception section 11, the rectification circuit 12, the matching circuit 13, and the regulator 14 correspond to a specific example of "charging section" in the present disclosure. The threshold Qth1 corresponds to a specific example of "first threshold" in the present disclosure, and the threshold Qth2 corresponds to a specific example of "second threshold" in the present disclosure.

(Operation and Function)

Subsequently, operation and a function of the power source device 1 in the first embodiment will be described.

(Overall Operation Outline)

First, the overall operation outline of the power source device 1 is described with reference to FIG. 1 and the like. The power reception section 11 receives power from the power transmission section 8 of the feeding device 9. The rectification circuit 12 rectifies the AC signal received by the power reception section 11. For example, the matching circuit 13 may adjust the power supplied from the rectification circuit 12. The regulator 14 steps down the voltage supplied from the matching circuit 13, and generates a voltage suitable for charting of the battery 16. The battery 16 stores therein the power supplied from the regulator 14. The heat storage section 20 stores therein the heat generated from various components in the power source device 1. The detection section 30 detects the state (for example, the temperature T, the pressure P, and the electric resistance value R) of the heat storage section 20. The control section 40 controls the operation of the regulator 14 and the feeding operation of the feeding device 9, based on the detected values relating to the heat storage section 20 detected by the detection section 30. The transmission and reception section 42 communicates with the feeding device 9 based on the instruction from the control section 40. The display section 43 informs a user of the operation state based on the instruction from the control section 40.

(Detailed Operation)

In the power source device 1, the heat generated in the respective components when the battery 16 is charged is transferred to the heat storage section 20, and the heat storage section 20 stores therein the heat. At this time, the control section 40 monitors the heat storage section 20 based on the temperature T, the pressure P, and the electric resistance value R of the heat storage section 20 that are detected by the detection section 30, and controls the power source section 10 based on the detected values.

FIG. 6 illustrates a flowchart of the monitoring operation in the power source device 1. The control section 40 monitors whether the power source device 1 operates normally, based on the temperature T, the pressure P, and the electric resistance value R of the heat storage section 20. When it is determined that the power source device 1 operates abnormally, the control section 40 controls the operation of the regulator 14 and the feeding operation of the feeding device 9, based on the heat storage amount Q of the heat storage section 20. The monitoring operation in the power source device 1 is described in detail below.

First, the control section 40 acquires the state of the heat storage section 20 through the detection section 30 (step S1). Specifically, the control section 40 acquires the temperature T of the heat storage section 20 with use of the temperature sensor 31, acquires the pressure P (the volume, the stress, the strain, and the like) of the heat storage section 20 with use of the pressure sensor 32, and acquires the electric resistance value R of the heat storage section 20 with use of the resistance sensor 33. Then, the control section 40 records the detected values together with the feeding time in a log file. At this time, the control section 40 may allow the display section 43 to display the detected values.

Next, the control section 40 determines whether the detected values acquired at the step S1 are normal (step S2). Specifically, for example, the control section 40 confirms whether the electric resistance value R detected at the step S1 is within a predetermined range of the electric resistance value that is considered normal. Then, for example, when the electric resistance value R is lower than a lower limit value of the predetermined range of the electric resistance value, the control section 40 determines that it is not normal because the large amount of heat is already stored in the heat storage section 20. Moreover, for example, when the electric resistance value R is higher than an upper limit value of the predetermined range of the electric resistance value, the control section 40 determines that it is not normal because the heat is not stored in the heat storage section 20 even though the feeding is performed and thus failure in a part of the power source device 1 is suspected. In addition, for example, when the electric resistance value R is within the predetermined range of the electric resistance value but, for example, the tendency of the electric resistance value R per feeding time largely departs from the tendency of the data recorded in the log file, the control section 40 determines that it is abnormal because failure in a part of the power source device 1 is suspected. Likewise, the control section 40 confirms whether the temperature T and the pressure P that are detected at the step S1 are each within a predetermined range that is considered normal.

Incidentally, for example, in the case where the heat storage section 20 is formed of the latent heat storage material, the control section 40 confirms whether the pressure P (the volume, the stress, the strain, and the like) detected at the step S1 is within a predetermined range that is considered normal.

When the control section 40 determines that any one of the detected values of the temperature T, the pressure P, and the electric resistance value R is not normal, the process proceeds to step S6, and when the control section 40 determines that all of the detected values are normal, the process proceeds to step S3.

When the control section 40 determines that the detected values are normal at the step S2, the control section 40 determines whether a sampling timing is readjusted (step S3), and changes the sampling timing as necessary (step S4). Specifically, for example, the control section 40 changes the sampling timing so that the number of sampling times per unit of time is decreased as the electric resistance value R is large and the number of sampling times per unit of time is increased as the electric resistance value R is small. In other words, when the electric resistance value R is high, the number of sampling times per unit of time is decreased because the large amount of heat is not stored in the heat storage section 20 and the heat storage section 20 is safe. On the other hand, when the electric resistance value R is low, the number of sampling times per unit of time is increased because the heat is stored in the heat storage section 20 and attention is necessary. After that, the process returns to the step S1 after the lapse of a predetermined time (step S5), and the flow is processed again.

When the control section 40 determines that the detected values are not normal at the step S2, the control section 40 calculates the heat storage amount Q (step S6). Specifically, for example, the control section 40 calculates the heat storage amount Q in the heat storage section 20 based on the pressure P and the electric resistance value R that are detected at the step S1. Specifically, as illustrated in FIG. 3, when the heat storage amount Q of the heat storage section 20 is within the range of Q1 to Q2 (within the range where the electronic phase transition occurs), the temperature T of the heat storage section 20 is substantially constant. Therefore, it is difficult to determine the heat storage amount Q with high accuracy with use of the detected temperature T. On the other hand, the pressure P and the electric resistance value R are changed even within the range where the electronic phase transition occurs. Thus, the heat storage amount Q is allowed to be determined with high accuracy with use of the pressure P and the electric resistance value R.

Next, the control section 40 compares the heat storage amount Q calculated at the step S6 with the threshold Qth1 (step S7). When the heat storage amount Q is larger than the threshold Qth1 (Q>Qth1), the control section 40 determines that the large amount of heat is already stored in the heat storage section 20, and thus the process proceeds to step S9. On the other hand, when the heat storage amount Q is equal to or lower than the threshold Qth1 (Q<=Qth1), as described in the description of the step S2, the control section 40 determines that a possibility of failure in a part of the power source device 1 is high, and allows the display section 43 to display occurrence of abnormality in the power source device 1 (step S8). Then, the process proceeds to step S15.

When the heat storage amount Q is larger than the threshold Qth1 (Q>Qth1) at the step S7, the control section 40 allows the display section 43 to display that the large amount of heat is already stored in the heat storage section 20 (step S9). At this time, for example, the display section 43 may display a residual capacity of heat storage capacity (for example "Qth2−Q").

Next, the control section 40 determines whether the operation mode is the safe mode (step S10). When the operation mode is not the safe mode, the mode is shifted to the safe mode (step S11). Specifically, the control section 40 controls the switching operation of the regulator 14 to operate the regulator 14 so as to decrease the power supplied to the battery 16, and to allow the feeding device 9 to operate so as to decrease the power fed to the power source device 1. Note that, at this time, the control section 40 may perform control in the power source device 1 so as to decrease the coupling between the power transmission section 8 and the power reception section 11. More specifically, for example, the position of the coil 62 in the power source device 1 may be moved, or the coil 62 may be covered with a physical barrier such as an electromagnetic shield. After that, the process returns to the step S1, and the flow is processed again. On the other hand, when the operation mode is the safe mode at the step S10, the process proceeds to step S12.

When the power source device 1 operates in the safe mode at the step S10, the control section 40 allows the display section 43 to display that the residual capacity of the heat storage capacity is small (step S12).

Then, the control section 40 compares the heat storage amount Q calculated at the step S6 with the threshold Qth2 (step S13). When the heat storage amount Q is larger than the threshold Qth2 (Q>Qth2), the control section 40 determines that the residual capacity of the heat storage capacity is little and further storage of the heat in the heat storage section 20 is dangerous. Thus, the process proceeds to step S14. On the other hand, when the heat storage amount Q is equal to or lower than the threshold Qth2 (Q<=Qth2), the control section 40 determines that the battery 16 is allowed to be further charged. Thus, the process returns to the step S1, and the flow is processed again.

When the heat storage amount Q is larger than the threshold Qth2 (Q>Qth2) at the step S13, the control section 40 allows the display section 43 to display that the operation of the power source device 1 is stopped (step S14).

Then, the control section 40 records the final state (step S15), and shifts the operation mode to the standby mode (step S16). Specifically, the control section 40 stops the power feeding to the power source device 1 from the feeding device 9 through the transmission and reception section 42.

The flow is completed.

As described above, the power source device 1 includes the heat storage section 20. Therefore, even when the large amount of power is supplied from the feeding device 9 and the battery 16 is charged with the large amount of power, the temperature increase associated with the charging is allowed to be suppressed. In other words, in the power source device 1, it is possible to increase the power supply amount to the battery 16 per unit of time. As a result, in the power source device 1, it is possible to charge the battery 16 in a shorter time.

In addition, in the power source device 1, the state of the heat storage section 20 is monitored by the sensors, and the charging of the battery 16 is controlled based on the detected values detected by the sensors. Therefore, the battery 16 is allowed to be charged safely. For example, when the battery 16 is charged without monitoring the state of the heat storage section 20 by the sensors, the temperature inside the enclosure of the power source device 1 is excessively high depending on the environment conditions (for example, at high temperature), and contingencies such as thermal destruction of the components of the power source device 1 may occur. On the other hand, in the power source device 1, since the charging of the battery 16 is controlled based on the detected values by the sensors, the battery 16 is allowed to be charged safely irrespective of the environment conditions and the like.

In addition, in the power source device 1, since the heat storage section 20 is configured using the electronic phase transition heat storage material, the configuration of the detection section 30 is allowed to be simplified. Specifically, for example, when the heat storage section 20 is configured using the electronic phase transition heat storage material whose electric conductivity changes depending on the heat storage state, the resistance sensor 33 is allowed to be configured with a simple configuration by forming an electrode on both ends of the electronic phase transition heat storage material and measuring the electric resistance value between the electrodes.

In addition, in the power source device 1, the plurality of sensors are provided in the detection section 30, and the state of the heat storage section 20 is determined based on the plurality of detected values (in this example, the temperature T, the pressure P, and the electric resistance value R). Therefore, the battery 16 is allowed to be charged more safely. For example, in the case where the state of the heat storage section 20 is determined based on a physical amount detected by one sensor, the state of the heat storage section 20 may be not accurately grasped, and the charging of the battery 16 may not be controlled appropriately. On the other hand, in the first embodiment, since the state of the heat storage section 20 is determined based on the plurality of detected values, for example, if one sensor is broken down, the state of the heat storage section 20 is allowed to be determined based on the detected values detected by the other sensors. Consequently, it is possible to charge the battery 16 more safely.

(Heat Storage Section 20)

Next, the heat storage section 20 is described. As described above, the heat storage section 20 may be configured using a solid phase transition heat storage material such as an electronic phase transition heat storage material, or a latent heat storage material. The solid phase transition heat storage material performs phase transition in a solid state, and thus it is unnecessary to provide a container unlike the latent heat storage material that is changed in phase between a solid and a liquid. Therefore, the solid phase transition heat storage material is easily handled. In addition, in the case where the heat storage section is configured using the solid phase transition heat storage material, it is possible to reduce change in volume of the heat storage section. Specifically, the voltage change in the case where the latent heat storage material is used is, for example, about 5% to about 15% both inclusive. In contrast, the voltage change in the case where the electronic phase transition heat storage material is used is, for example, about 0.1% or lower. Therefore, the heat storage section configured using the solid phase transition heat storage material is advantageously easily mounted on an electronic apparatus. The heat storage characteristics of $VO_2$ that is one of the electronic phase transition heat storage materials are described below as an example.

FIG. 7 illustrates results of a differential scanning calorimetry (DSC) measurement of $VO_2$ powder. A characteristic W1 indicates characteristics in the case where a temperature is increased by 10 deg C. per one minute (10 deg C./min.), and a characteristic W2 indicates characteristics in the case where a temperature is decreased by 10 deg C. per one minute (10 deg C./min.). As illustrated in FIG. 7, when the temperature is increased, an endothermic peak appears at about 70 deg C. as illustrated by the characteristic W1, and when the temperature is decreased, a heat dissipation peak appears at about 67 deg C. as illustrated by the characteristic W2. As described above, the transition temperature Tpc of $VO_2$ is about 67 deg C. that is a temperature suitable for use of the heat storage section 20 that stores therein the heat generated in the heating components 19.

In the case where the heat storage section 20 is configured using $VO_2$, for example, sintered $VO_2$ powder may be used. Specifically, for example, $VO_2$ powder and binder are mixed, the mixture is subjected to vacuum hot pressing with use of a pulse conduction heating type sintering apparatus, the resultant is sintered at a sintering temperature of about 1000 deg C. to about 1100 deg C. both inclusive, and thus a sintered pellet is generated. The $VO_2$ sintered body whose sintered density was about 81% was generated. The generated $VO_2$ sintered body had a size of 10 mm*10 mm*4 mm and a weight of 1.3 g, and the heat storage amount thereof was about 65 J. The $VO_2$ sintered body was placed on a heat source (a ceramics heater), and temperature variation thereof was measured during heat storage and during heat dissipation.

FIG. 8 illustrates the temperature variation of the $VO_2$ sintered body during the heat storage and during the heat dissipation. In this example, the heat source is turned on at a time of 0, and the heat source is turned off after 10 minutes. A characteristic W3 indicates the case where the temperature sensor is disposed on a top surface of the $VO_2$ sintered body, and a characteristic W4 indicates the case where the temperature sensor is disposed between the heat source and the $VO_2$ sintered body. In addition, a characteristic W5 indicates, as a reference, the case where the $VO_2$ sintered body is not placed on the heat source and the temperature sensor is disposed on the heat source.

On the top surface of the $VO_2$ sintered body (the characteristic W3), the temperature starts to increase after the heat source is turned on, and the temperature becomes stable once at near the transition temperature Tpc (about 67 deg C.). At this time, phase transition occurs in the $VO_2$ sintered body. Then, after completion of the phase transition, the temperature of the $VO_2$ sintered body starts to increase again. When the heat source is turned off, the temperature of the $VO_2$ sintered body starts to decrease, the temperature becomes stable once at near the transition temperature Tpc, and then, starts to decrease again. Incidentally, at the position between the heat source and the $VO_2$ sintered body (the characteristic W4), it is affected by both the temperature of the heat source and the temperature of the $VO_2$ sintered body. However, the start time point and the end time point of the phase transition in the $VO_2$ sintered body are allowed to be grasped from behavior of the temperature variation.

In this example, $VO_2$ sintered body is generated from $VO_2$ powder. However, this is not limitative, and in the case where other electronic phase transition heat storage material is used, a sintered body is allowed to be generated from powder of the material similarly. In addition, instead of sintering the powder, a crystalline body may be generated by crystal growth from melt or solution, and then the crystalline body may be cut to an appropriate size to form the heat storage section 20.

At the time of sintering the powder, ceramics such as a glass component (for example, silica, boron oxide, or the like) may be added as a sintering assistant. As a result, the sintering temperature is allowed to be lowered. Moreover, for example, the enclosure of the heating components 19 is allowed to be configured using such a material. Specifically, for example, a semiconductor package is configured, and heat generated by heating semiconductor is allowed to be stored.

Moreover, for example, the electronic phase transition heat storage material may be compounded with a metal. Examples of the metal may include, for example, aluminum (Al), copper (Cu), magnesium (Mg), titanium (Ti), iron (Fe), nickel (Ni), zinc (Zn), silver (Ag), tin (Sn), indium (In), antimony (Sb), bismuth (Bi), and lead (Pd), and an alloy (for example, stainless steel) containing one or more thereof. At the time of compounding, the electronic phase transition heat storage material may be compounded with one or more of the metals or the alloy. At this time, for example, the powder of the electronic phase transition heat storage material and the metallic powder may be mixed and sintered. In the case where the $VO_2$ powder and Al powder are mixed and sintered, for example, the $VO_2$ powder of 81% and the Al powder of 19% may be mixed in a volume ratio. This enables lowering in sintering temperature, increase in sintering density, increase in heat conductivity, strength enhancement, and facilitates soldering of the heat storage section 20 to the heating components 19 and the substrate. In addition, with use of the material compounded with a metal in this way, for example, an enclosure of the heating components (such as a semiconductor package), an enclosure of an electronic apparatus such as the power source device 1, a sheet metal, a heat spreader, a heat sink, etc. may be configured. Accordingly, a heat storage function is provided to the enclosures or the components. Specifically, for example, an aluminum alloy or a magnesium alloy is often used for the enclosure of the electronic apparatus. Therefore, the electronic phase transition heat storage material is compounded with the aluminum alloy or the magnesium alloy to add the heat storage function, in addition to the function as the enclosure and the heat dissipation function.

Moreover, for example, the electronic phase transition heat storage material may be compounded with plastic. Examples of the plastic may include, for example, polycarbonate (PC), polystyrene (PS), acrylonitrile butadiene styrene resin (ABS), polyphenylene sulfide (PPS), phenolic resin (PF), epoxy resin (EP), melamine resin (MF), urea resin (UF), polyurethane (PUR), polyimide (PI), polyethylene (PE), polypropylene (PP), polyvinyl chloride (PVC), polyvinyl acetate (PVAc), polytetrafluoroethylene (PTEE), acrylic resin, nylon, polyacetal (POM), polyester (PE), liquid crystal polymer, and polyamide imide (PAI). At the time of compounding, the electronic phase transition heat storage material may be compounded with one or more thereof. For example, a heat storage sheet, an enclosure of the heating components 19 (such as a semiconductor package), an enclosure of an electronic apparatus such as the power source device 1, a plastic frame, a substrate, etc. may be configured with use of such composite materials. Accordingly, a heat storage function is provided to the enclosures or the components. In addition, to increase heat conductivity, ceramics (such as alumina), metal particles (such as aluminum), a carbon fiber, and the like may be further compounded.

Moreover, for example, the electronic phase transition heat storage material may be compounded with rubber or gel. Examples of the rubber and the gel may include, for example, silicone based, acrylic based, urethane based, α-olefin based, styrene based, and fluorine based rubber or gel. At the time of compounding, the electronic phase transition heat storage material may be compounded with one or more thereof. For example, a flexible heat dissipation sheet may be configured using such a composite material. For example, when a heat sink or the like is thermally connected to the heating components 19 through the heat dissipation sheet, the heat generated in the heating components 19 is allowed to be stored, and the heat is dissipated from the heat sink. In addition, to increase the heat conductivity, ceramics (such as alumina), metal particles (such as aluminum), a carbon fiber, and the like may be further compounded.

Moreover, for example, the electronic phase transition heat storage material may be compounded with a potting agent (a sealing agent or an adhesive agent) to increase heat dissipation property. As the potting agent, for example, an agent containing, as a main component, silicone based, urethane based, epoxy based, phenol based, or polyimide based material may be used. At the time of compounding, the electronic phase transition heat storage material may be compounded with one or more thereof. Such a composite material is filled in a gap in the electronic apparatus and is cured to fill a gap between components having irregularity. As a result, it is possible to store heat generated from the heating components 19, and to dissipate to the enclosure and the like. Furthermore, to increase the heat conductivity, ceramics (such as alumina), metal particles (such as aluminum), a carbon fiber, and the like may be further compounded.

As described above, the electronic phase transition heat storage material is used for the heat storage section 20, which enables easy composition with other materials.

(Effects)

As described above, in the first embodiment, the heat storage section is provided. Therefore, it is possible to increase the capacity with respect to the inflow heat amount (the maximum inflow heat amount) per unit of time, and to increase power supply amount to the battery per unit of time. Consequently, it is possible to charge the battery in a shorter time.

In the first embodiment, the state of the heat storage section is monitored by the sensors, and the charging of the battery is controlled based on the detected values detected by the sensors. Therefore, it is possible to charge the battery safely.

In the first embodiment, the state of the heat storage section is determined based on the detected valued detected by the plurality of sensors. Therefore, it is possible to charge the battery more safely.

In the first embodiment, since the electronic phase transition heat storage material is used to configure the heat storage section, it is unnecessary to provide a container and handling thereof is easy. In addition, the electronic phase transition heat storage material is less varied in volume, and is easily compounded with other materials. Therefore, it is possible to realize the heat storage section easily mounted on electronic apparatuses.

(Modification 1-1)

In the above-described first embodiment, the heating components 19 and the heat storage section 20 are thermally connected to one another by a heat conductive sheet and the like. However, this is not limitative, and various method described bellow may be used.

For example, as illustrated in FIG. 9A, each of the heating components 19 and the heat storage section 20 may be thermally connected to each other by a heat conduction section 91. Examples of the heat conduction section 91 may include a metallic structure including a heat pipe, resin such as grease, elastomer, and rubber, which are added with a material having increased heat conductivity such as gold nanoparticles, and phase change materials.

In addition, for example, as illustrated in FIG. 9B, each of the heating components 19 and the heat storage section 20 may be thermally connected to each other by a heat transfer section 92 that transfers heat in a method other than the heat conduction. Specifically, the heat may be transferred from the heating component 19 to the heat storage section 20 through convection with gas or liquid as a vehicle, or the heat may be transferred through radiation.

Moreover, in the case where the respective heating components 19 and the heat storage section 20 are formed of materials that have high affinity, for example, as illustrated in FIG. 9C, the heat storage section 20 may be integrally formed with the heating component 19. Specifically, for example, in the case where the heating component 19 is a piezoelectric transformer, the transformer 15 and the heat storage section 20 may be integrally formed by a baking process of ceramics. In addition, for example, in the case where the heating component 19 is a magnetic core of a transformer, the core of the transformer may be configured of a vanadium oxide compound, and the heat storage section 20 may be configured of a material containing a vanadium oxide. Further, in this case, as illustrated in FIG. 9D, the heating components 19 and the heat storage section 20 may be alternately stacked. In the cases of FIGS. 9C and 9D, a component (for example, a transformer) becoming the heating component 19 and the heat storage section 20 are allowed to be manufactured at the same time. Therefore, it is possible to reduce the number of components in the power source device 1, and to decrease its cost.

Moreover, for example, as will be described below, the heat storage section 20 may be configured so as to be mounted on a surface of the heating component 19 or a surface of a substrate with use of a solder.

FIG. 10 illustrates a configuration example of the heat storage section 20 in which a metallic film is formed on a part of the surface. In this example, the heat storage section 20 is a small chip component such as a so-called ship resistor. Further, a metallic film 21 is formed on a part of the heat storage section 20. The metallic film 21 allows the heat storage section 21 to be mounted on a surface of the heating component 19 or a substrate with use of a solder and the like. Accordingly, heat resistance is allowed to be decreased as compared with the case where the heat storage section 20 is thermally connected to the heating component 19 or the substrate through, for example, a heat conductive sheet, and thus the heat is allowed to be more efficiently stored in the heat storage section 20. In addition, when the heat storage section 20 is mounted on the substrate or the like, the heat storage section 20 is allowed to be easily mounted with use of a so-called mounter. The surface of the metallic film 21 may be subjected to plating treatment with use of nickel. For example, the metallic film 21 may be formed by sputtering a metal on the surface of the heat storage section 20. In addition, for example, in the case where the heat storage section 20 is formed by sintering, the metallic film 21 may be formed at the same time in the sintering process. Specifically, for example, slurry of a metal and an organic substance are applied to the heat storage section 20 before sintering, to form the metallic film 21.

In this example, the metallic film 21 is provided on the heat storage section 20, however, the configuration is not limited thereto. Alternatively, for example, a lead for surface mounting may be provided on the heat storage section 20. Moreover, although the surface mounting is performed in this example, this is not limitative. Alternatively, for example, a lead that is inserted in a hole of a substrate or the like to fix the heat storage section 20 is provided on the heat storage section 20, and through hole mounting may be performed.

(Modification 1-2)

In the above-describe first embodiment, as illustrated in FIG. 5, the heating components 19 and the heat storage section 20 are thermally and directly connected to one another. However, the configuration is not limited thereto, and alternatively, for example, as illustrated in FIG. 11 to FIG. 13, the heating components 19 and the heat storage section 20 may be thermally and indirectly connected through thermal buffers 67 and 68. The thermal buffers 67 and 68 function as thermal buffer materials. Specifically, the thermal buffers 67 and 68 store heat similarly to the heat storage section 20, and the heat capacity thereof is smaller than that of the heat storage section 20. In the example of FIG. 11, each of the heating components 19 is thermally connected to the corresponding thermal buffer 67, and the thermal buffers 67 are thermally connected to the heat storage section 20. In the example of FIG. 12, all of the heating components 19 are thermally connected to one thermal buffer 68, and the thermal buffer 68 is thermally connected to the heat storage section 20. In the example of FIG. 13, the heating components 19 are thermally connected to respective corresponding thermal buffers 67, the thermal buffers 67 are thermally connected to one thermal buffer 68, and the thermal buffer 68 is thermally connected to the heat storage section 20. Incidentally, the configuration is not limited thereto, and alternatively, for example, in FIG. 11 and FIG. 13, one or more of the plurality of thermal buffers 67 may be omitted.

(Modification 1-3)

In the above-described first embodiment, as illustrated in FIG. 4A, the heat storage section 20 is provided inside the enclosure 60. However, the configuration is not limited thereto, and alternatively, for example, as illustrated in FIG. 14, the heat storage section 20 may be included in a part of the enclosure 60. In addition, the enclosure itself may be configured as the heat storage section 20. As a result, the heat generated inside the enclosure is allowed to be stored in the enclosure, and the heat is allowed to be dissipated from the enclosure. In addition, for example, as illustrated in FIG. 15 and FIG. 16, the heat storage section 20 may be provided outside the enclosure 60. In the example of FIG. 15, the thermal buffer 68 is thermally connected to the heat storage section 20 through the enclosure 60. In the example of FIG. 16, the thermal buffer 68 is thermally connected to the heat storage section 20 without through the enclosure 60. Note that the configuration is not limited thereto, and alternatively, for example, in the configurations of FIGS. 14 to 16, one or more of the plurality of thermal buffers 67 and the thermal buffer 68 may be omitted. Specifically, for example, all of the thermal buffers 67 and 68 may be omitted.

(Modification 1-4)

In the above-described first embodiment, the detection section 30 is configured of the three sensors (the temperature sensor 31, the pressure sensor 32, and the resistance sensor 33). However, the configuration is not limited thereto, and any sensor may be used as long as the sensor can monitor the state of the heat storage section 20. Specifically, for example, an infrared sensor, a doppler sensor, a magnetic/electrostatic sensor, a displacement meter/strain gauge, a permeability sensor, a permittivity sensor, a gas sensor, and the like may be used besides the temperature sensor 31, the pressure sensor 32, and the resistance sensor 33. Moreover, the number of sensors is not limited to three, and for example, as with a power source device 1C illustrated in FIG. 17, a detection section 30C may be configured using only one sensor (in this example, the temperature sensor 31), or a detection section may be configured using two or four or more sensors. Further, for example, as with a power source device 1D illustrated in FIG. 18, one or a plurality of sensors (in this example, the temperature sensor 31, the pressure sensor 32, and the resistance sensor 33) may be configured integrally with a heat storage section 20D. Specifically, for example, in the case where the heat storage section 20D is configured using an electronic phase transition heat storage material whose electric conductivity is changed depending on the heat storage state, an electrode may be formed on both ends of the electronic phase transition heat storage material, and the electric resistance value R between the electrodes may be measured.

(Modification 1-5)

In the above-described first embodiment, as illustrated in FIG. 3, the threshold $Q_{th1}$ is set to a value between the heat storage amount $Q_1$ and the heat storage amount $Q_2$, and the threshold $Q_{th2}$ is set to the heat storage amount $Q_2$. However, this is not limitative. For example, in the case where the power source device 1 is not largely affected by the temperature even when the temperature of the heat storage section 20 is higher than the transition temperature $T_{pc}$, for example, as illustrated in FIG. 19, the threshold $Q_{th1}$ may be set to a value higher than the heat storage amount $Q_2$, and the threshold $Q_{th2}$ may be set to a value higher than the set threshold $Q_{th1}$. Also in this case, for example, when the heat storage amount Q exceeds the threshold $Q_{th1}$, the control section 40 sets the operation mode to the safe mode, and when the heat storage amount Q exceeds the threshold $Q_{th2}$, the control section 40 sets the operation mode to the standby mode. In other words, as illustrated in FIG. 19, when the temperature causing large effect to the power source device 1 is set to the temperature $T_1$, the heat storage amount Q corresponding to the temperature $T_1$ may be set to the threshold $Q_{th2}$.

(Modification 1-6)

In the above-described first embodiment, as illustrated in FIG. 6, the heat storage amount Q of the heat storage section 20 is calculated when the detected values relating to the heat storage section 20 are not normal. However, this is not limitative, and alternatively, for example, as illustrated in FIG. 20, the heat storage amount Q may be calculated in first, and then determination whether the detected values are normal may be performed as necessary. A power source device 1E according to the present modification will be described in detail below.

First, a control section 40E of the power source device 1E acquires the state of the heat storage section 20 through the detection section 30 (step S21), similarly to the steps S1 and S2 according to the above-described first embodiment, and then calculates the heat storage amount Q based on the pressure P and the electric resistance value R that are detected at the step S21 (step S22).

Subsequently, the control section 40E compares the heat storage amount Q calculated at the step S22 with the threshold $Q_{th1}$ (step S23). Then, when the heat storage amount Q is larger than the threshold $Q_{th1}$ ($Q>Q_{th1}$), the control section 40E determines that the large amount of heat is already stored in the heat storage section 20, and thus the process proceeds to step S29. On the other hand, when the heat storage amount Q is equal to or lower than the threshold $Q_{th1}$ ($Q<=Q_{th1}$), the process proceeds to step S24.

When the heat storage amount Q is equal to or lower than the threshold Qth1 (Q<=Qth1) at the step S23, the control section 40E determines whether the detected values acquired at the step S21 are normal (step S24). Specifically, for example, the control section 40E confirms whether the electric resistance value R detected at the step S21 is within the predetermined range of the electric resistance value that is considered normal. Then, for example, when the electric resistance value R is higher than an upper limit value of the predetermined range of the electric resistance value, the control section 40E determines that it is abnormal because the heat is not stored in the heat storage section 20 even though the feeding is performed and thus failure in a part of the power source device 1E is suspected. In addition, for example, when the electric resistance value R is within the predetermined range of the electric resistance value but, for example, the tendency of the electric resistance value R per feeding time largely departs from the tendency of the data recorded in the log file, the control section 40E determines that it is abnormal because failure in a part of the power source device 1E is suspected. Likewise, the control section 40E confirms whether the temperature T and the pressure P that are detected at the step S21 are each within a predetermined range that is considered normal.

Incidentally, for example, in the case where the heat storage section 20 is formed of the latent heat storage material, the control section 40E also confirms whether the pressure P (the volume, the stress, the strain, and the like) detected at the step S21 is within a predetermined range that is considered normal.

When the control section 40E determines that the detected values of the temperature T, the pressure P, and the electric resistance value R are normal, the control section 40E determines whether a sampling timing is readjusted (step S25), similarly to the steps S3 to S6 according to the above-described first embodiment, and changes the sampling timing as necessary (step S26). The process then returns to the step S1 after the lapse of a predetermined time (step S27). On the other hand, when the control section 40E determines that any one of the detected values of the temperature T, the pressure P, and the electric resistance value R is not normal, as described in the description of the step S23, the control section 40E determines that a possibility of failure in a part of the power source device 1E is high, and allows the display section 43 to display occurrence of abnormality in the power source device 1E (step S28). Then, the process proceeds to step S35.

When the heat storage amount Q is larger than the threshold Qth1 (Q>Qth1) at the step S23, the control section 40E allows the display section 43 to display that the large amount of heat is already stored in the heat storage section 20 (step S29).

The subsequent flow is similar to that in the above-described first embodiment.

(Modification 1-7)

In the above-described first embodiment, the power source device 1 receives the power from the feeding device 9 through electromagnetic induction. However, this is not limitative, and the power source device 1 may receive the power through magnetic field resonance or electric field resonance. In addition, the power source device 1 may receive the power through electrostatic induction such as electric field coupling. In this case, the power transmission section 8 and the power reception section 11 each include an electrode instead of the coils 62 and 72. In addition, the power source device 1 may receive the power through electromagnetic waves. In this case, the power transmission section 8 and the power reception section 11 each include an antenna or a rectenna instead of the coils 62 and 72. Moreover, the power source device 1 may receive the power through infrared radiation. In these cases, as with the above-described first embodiment, providing the heat storage section 20 in the power source device 1 enables increase in the power supply amount to the battery 16 per unit of time, and thus it is possible to charge the battery 16 in a shorter time.

(Modification 1-8)

In the above-described first embodiment, for example, as illustrated in FIG. 6, the operation mode is shifted to the standby mode when the heat storage amount Q is larger than the threshold Qth2 (Q>Qth2), or the like, and the feeding to the power source device 1 from the feeding device 9 is stopped. However, this is not limitative, and alternatively, for example, when it is determined that the detected values are not normal at the step S2, the feeding to the power source device 1 from the feeding device 9 is temporarily stopped, and after that, when the heat storage amount Q is equal to or lower than the threshold Qth2 (Q<=Qth2), or the like, the feeding to the power source device 1 from the feeding device 9 may be resumed.

(Modification 1-9)

In the above-described first embodiment, the control section 40 controls the operation of the power source section 10 based on, for example, the temperature T of the heat storage section 20. At this time, variation of the temperature T with time may be acquired. Specifically, for example, detection results of a series of the temperature T such as characteristics W3 and W4 illustrated in FIG. 8 may be acquired, the start time point and the end time point of the phase transition in the heat storage section 20 may be acquired based on a curve of the temperature variation, and the operation of the power source section 10 may be controlled in consideration of the acquired results. As a result, it is possible to grasp the state of the heat storage section 20 more accurately, for example, even in the case where the temperature sensor 31 is provided slightly apart from the heat storage section 20, or even in the case where the detected temperature is affected by the heating components 19 (for example, the characteristic W4 in FIG. 8).

<2. Second Embodiment>

Next, a power source device 2 according to a second embodiment is described. In the second embodiment, a plurality of heat storage sections 20 is provided. Other configurations are similar to those in the above-described first embodiment (FIG. 1 and the like). Note that like numerals are used to designate substantially like components of the power source device 1 according to the above-described first embodiment, and the description thereof is appropriately omitted.

FIG. 21 illustrates a configuration example of the power source device 2 according to the second embodiment. FIG. 22 illustrates thermal connection in the power source device 2. The power source device 2 includes the plurality of heat storage sections 20, a plurality of detected sections 30, and a control section 50.

As illustrated in FIG. 22, each of the heat storage sections 20 is provided corresponding to each of the heating components 19. Incidentally, in this example, each of the heat storage sections 20 is provided corresponding to each of eight heating components 19; however, the configuration is not limited thereto. For example, each of the heat storage sections 20 may be provided corresponding to one or more of these heating components 19, or may be provided corresponding to a heating component 19 other than these heating components 19. As illustrated in FIG. 21, each of the detection sections 30 is provided corresponding to each of the heat storage sections 20. In other words, each of the detection sections 30 detects the state of the corresponding heat storage section 20. In this case, the heat storage section 20 corresponds to a specific example of "individual heat storage section" in the present disclosure.

The control section 50 controls operation of the power source section 10, based on the temperature T, the pressure P, and the electric resistance value R that are detected by the plurality of detection sections 30. The control section 50 includes an ADC 51. The ADC 51 converts the detected values that are analog values supplied from the plurality of detection sections 30, into digital values. Similarly to the control section 40 according to the above-described first embodiment, the control section 50 controls the operation of the regulator 14 and the feeding operation of the feeding device 9, based on the detected values converted into the digital values, to control the charging of the battery 16.

With this configuration, the control section 50 monitors the respective heat storage sections 20 based on the temperature T, the pressure P, and the electric resistance values R of the respective heat storage sections 20 that are detected by the respective detection sections 30, and controls the charging of the battery 16 based on the detected values. At this time, since the control section 50 can monitor individually the respective heat storage sections 20, it is possible to grasp more detailed state of the power source device 2, and to enhance flexibility at the time when the control section 50 controls the charging.

As described above, in the second embodiment, the plurality of heat storage sections is provided. Therefore, it is possible to enhance flexibility at the time when the charging of the battery is controlled. Other effects are similar to those in the above-described first embodiment.

(Modification 2-1)

In the above-described second embodiment, as illustrated in FIG. 22, the heating components 19 and the heat storage sections 20 are respectively thermally connected directly. However, the configuration is not limited thereto, and alternatively, for example as illustrated in FIG. 23, the heating components 19 and the heat storage sections 20 are respectively thermally connected indirectly through corresponding thermal buffers 81. Note that the configuration is not limited thereto, and alternatively, for example, one or more of the plurality of thermal buffers 81 and the plurality of heat storage sections 20 may be omitted.

(Modification 2-2)

In the above-described second embodiment, the plurality of heat storage sections 20 corresponding to the respective heating components is provided. However, the configuration is not limited thereto, and for example, as illustrated in FIG. 24, one heat storage section 80 that is thermally connected to the plurality of heat storage sections 20 may be further provided. The heat storage section 80 corresponds to a specific example of "another heat storage section" in the present disclosure. Note that the configuration is not limited thereto, and alternatively, for example, one or more of the plurality of thermal buffers 81 and the plurality of heat storage sections 20 may be omitted.

(Modification 2-3)

In the above-described second embodiment, the plurality of heat storage sections 20 is provided inside the enclosure 60. However, the configuration is not limited thereto, and alternatively, for example, as illustrated in FIG. 25, the plurality of heat storage sections 20 may be included in a part of an enclosure 60E. In this example, the heating components 19 and the plurality of thermal buffers 81 are provided inside the enclosure 60E, and the plurality of thermal buffers 82, the plurality of heat storage sections 20, and one heat storage section 80 are configured as a part of the enclosure 60E. Each of the heating components 19 is thermally connected to the corresponding thermal buffer 81, each of the thermal buffers 81 is thermally connected to the corresponding thermal buffer 82, each of the thermal buffers 82 is thermally connected to the corresponding heat storage section 20, and the heat storage sections 20 are all thermally connected to one heat storage section 80. Note that the configuration is not limited thereto, and for example, one or more of the plurality of thermal buffers 81 and 82, the plurality of heat storage sections 20, and the heat storage section 80 may be omitted. Specifically, for example, all of the thermal buffers 81 and 82 may be omitted.

Moreover, for example, as illustrated in FIGS. 26 and 27, the plurality of heat storage sections 20 may be disposed outside the enclosure 60. In these examples, the heating components 19 and the plurality of thermal buffers 81 are provided inside the enclosure 60, and the plurality of thermal buffers 82, the plurality of heat storage sections 20, and one heat storage section 80 are provided outside the enclosure 60. In the example of FIG. 26, each of the heating components 19 is thermally connected to the corresponding thermal buffer 81, and each of the thermal buffers 81 is thermally connected to the corresponding thermal buffer 82 through the enclosure 60, each of the thermal buffers 82 is thermally connected to the corresponding heat storage section 20, and the heat storage sections 20 are all thermally connected to one heat storage section 80. In this example, the heat storage sections 20 are thermally connected to the enclosure 60. In addition, in the example of FIG. 27, each of the heating components 19 is thermally connected to the corresponding thermal buffer 81, each of the thermal buffers 81 is thermally connected to the corresponding thermal buffer 82 without through the enclosure 60, each of the thermal buffers 82 is thermally connected to the corresponding heat storage section 20, and the heat storage sections 20 are all thermally connected to one heat storage section 80. Note that the configuration is not limited thereto, and for example, in the configurations of FIGS. 26 and 27, one or more of the plurality of thermal buffers 81 and 82, the plurality of heat storage sections 20, and the heat storage section 80 may be omitted. Specifically, for example, all of the thermal buffers 81 and 82 may be omitted.

(Modification 2-4)

In addition, any of the modifications according to the above-described first embodiment may be applied as appropriate.

<3. Application Examples>

Then, application examples of the power source device described in the above-described respective embodiments and modifications thereof will be described.

FIGS. 28A and 28B each illustrate an appearance of a digital camera to which the power source device according to any of the respective embodiments and the like is applied. For example, the digital camera may include a light emitting section 521 for flash, a display section 522, a menu switch 523, and a shutter button 524. The digital camera includes the power source device according to any of the above-described respective embodiments and the like.

The power source device according to any of the above-described respective embodiments and the like is applicable to electronic apparatuses in every field, such as a video camera, a portable game machine, a mobile phone, a mobile storage, a mobile battery, and a notebook personal computer, in addition to such a digital camera. In other words, the power source device according to any of the above-described respective embodiments and the like is applicable to electronic apparatuses having a battery in every field.

Hereinbefore, although the technology has been described with referring to some embodiments, the modifications, and the application examples to the electronic apparatuses, the technology is not limited thereto, and various modifications may be made.

For example, in the above-described respective embodiments and the like, the power source devices 1 and 2 are supplied with the power from the feeding device 9 through wireless feeding; however, the feeding method is not limited thereto. For example, as illustrated in FIG. 29, the power may be supplied through wired feeding. In this example, a power source device 1F is supplied with the power from an AC adopter 9F through wired feeding. The power source device 1F includes a power source section 10F, the heat storage section 20, the detection section 30, the control section 40, and the display section 43. The power source section 10F includes the regulator 14 and the battery 16. The regulator 14 steps down a DC voltage supplied from a power source section 8F of the AC adopter 9F, and generates a voltage suitable for charging of the battery 16. In this case, in the safe mode, similarly to the above-described respective embodiments, the control section 40 controls the switching operation of the regulator 14 to reduce the voltage supplied to the battery 16. Incidentally, at this time, further, the power source section 8F of the AC adopter 9F may return the power to the power source system that supplies the power to the AC adopter 9F.

Moreover, for example, in the above-described respective embodiments and the like, the power source devices 1 and 2 are so-called jacket type power source devices that are used while being mounted on the mobile phone 6. However, this is not limitative, and for example, as illustrated in FIG. 30, the power source device 1 or 2 may be applied to a mobile phone 6G (in this example, a smartphone) itself.

Furthermore, for example, in the above-described respective embodiments and the like, the present technology is applied to the power source device. However, the present technology is allowed to be applied to various electronic apparatuses such as a semiconductor device and a display panel, without limitation. Specifically, for example, a semiconductor device such as a processor generally generates a large amount of heat. The temperature inside the enclosure of the electronic apparatus including such a semiconductor device may be accordingly increased. Therefore, a heat storage section is thermally connected to such a semiconductor device, and the state of the heat storage section is monitored by sensors, which enables control of a clock frequency and the like of the semiconductor device. At this time, for example, as with a notebook personal computer 100 illustrated in FIG. 31, a heat storage sheet 105 as the heat storage section may be disposed so as to cover a semiconductor device 104. Incidentally, the configuration is not limited thereto, and for example, the heat storage section may be configured as a chip component and the heat storage section may be mounted on a surface of a substrate 103 in the vicinity of the semiconductor device 104 by a solder. In addition, display panels such as a liquid crystal display panel and an organic electro luminescence (EL) display panel also generally generate heat, and the temperature inside the enclosure of the display panel may be increased. Therefore, a heat storage section is thermally connected to a component that generates heat in the display panel, and the state of the heat storage section is monitored by sensors, which enables control of the display luminance and the like. As a result, it is possible to suppress the temperature increase inside the enclosure of the electronic apparatus, and to get the best performance of the electronic apparatus.

Note that the present technology may be configured as follows.

(1)

An electronic apparatus including:

a heating section;

a heat storage section;

a detection section configured to detect a heat storage amount of the heat storage section; and a control section configured to control operation of the heating section, based on the heat storage amount detected by the detection section.

(2)

The electronic apparatus according to (1), wherein the detection section detects the heat storage amount, based on one or more of a temperature, an electric resistance value, a volume, stress, and strain of the heat storage section.

(3)

The electronic apparatus according to (1) or (2), wherein the heating section includes one or a plurality of heating components thermally connected to the heat storage section.

(4)

The electronic apparatus according to (3), wherein the heat storage section includes one or a plurality of individual heat storage sections thermally connected to the respective heating components.

(5)

The electronic apparatus according to (4), wherein one of the one or the plurality of individual heat storage sections is configured integrally with a corresponding heating component.

(6)

The electronic apparatus according to (4) or (5), further including a heat dissipation component connected to one of the one or the plurality of heating components, wherein the heat dissipation component is configured integrally with the individual heat storage section corresponding to the heating component that is connected to the heat dissipation component.

(7)

The electronic apparatus according to any one of (4) to (6), wherein one of the one or the plurality of individual heat storage sections is configured of a solid phase transition material.

(8)

The electronic apparatus according to (7), wherein the solid phase transition material is an electronic phase transition material.

(9)

The electronic apparatus according to any one of (4) to (6), wherein one of the one or the plurality of individual heat storage sections is configured by compounding a solid phase transition material with one or more metals.

(10)

The electronic apparatus according to (9), wherein the metal is one of aluminum (Al), copper (Cu), Magnesium (Mg), titanium (Ti), iron (Fe), nickel (Ni), zinc (Zn), silver (Ag), tin (Sn), indium (In), antimony (Sb), bismuth (Bi), and lead (Pd).

(11)

The electronic apparatus according to any one of (4) to (6), wherein one of the one or the plurality of individual heat storage sections is configured by compounding a solid phase transition material with one of rubber and gel.

(12)
The electronic apparatus according to any one of (4) to (11), wherein one of the one or the plurality of individual heat storage sections has a metallic film on a part of a surface of the individual heat storage section, and the individual heat storage section having the metallic film is connected to a corresponding heating component by a solder through the metallic film.

(13)
The electronic apparatus according to any one of (4) to (12), wherein one of the one or the plurality of individual heat storage sections is configured of a latent heat storage material.

(14)
The electronic apparatus according to (4) to (13), further including
another heat storage section connected to the one or the plurality of individual heat storage sections.

(15)
The electronic apparatus according to any one of (1) to (14), wherein the heating section is a charging section configured to charge a battery.

(16)
The electronic apparatus according to (15), wherein the heating section further includes a battery.

(17)
The electronic apparatus according to (15) or (16), wherein the control section performs control to decrease a power supply amount to the battery when the heat storage amount is larger than a first threshold, and performs control to stop power supply to the battery when the heat storage amount is larger than a second threshold.

(18)
The electronic apparatus according to any one of (15) to (17), wherein the charging section charges the battery, based on power received from a feeding device through wireless feeding.

(19)
The electronic apparatus according to (18), wherein the charging section receives power from the feeding device through one or more of electromagnetic induction, electrostatic induction, infrared radiation, and electromagnetic waves.

(20)
The electronic apparatus according to any one of (15) to (17), wherein the charging section charges the battery, based on power received from a feeding device through wired feeding.

(21)
The electronic apparatus according to any one of (1) to (14), wherein the heating section is a semiconductor circuit.

(22)
The electronic apparatus according to any one of (1) to (14), wherein the heating section is a display panel.

(23)
The electronic apparatus according to any one of (1) to (22), wherein the heating section is placed in an enclosure including the heat storage section.

(24)
The electronic apparatus according to any one of (1) to (22), wherein the heating section is placed in an enclosure that is configured as the heat storage section.

(25)
The electronic apparatus according to any one of (1) to (22), wherein
the heating section is placed in an enclosure, and
the heat storage section is disposed outside the enclosure, and is thermally connected to the heating section through the enclosure.

(26)
The electronic apparatus according to any one of (1) to (22), wherein
the heating section is placed in an enclosure, and
the heat storage section is disposed outside the enclosure, and is thermally connected to the heating section without through the enclosure.

(27)
The electronic apparatus according to any one of (1) to (22), wherein the heating section and the heat storage section are placed in an enclosure.

(28)
A method of controlling an electronic apparatus, the method including:
detecting a heat storage amount of a heat storage section, the heat storage section being configured to store therein at least a part of heat generated from a heating section provided in an electronic apparatus; and
controlling operation of the heating section, based on the detected heat storage amount.

(29)
A power reception device having a first side and a second side, comprising:
an electric device disposed along the first side;
a contact member disposed along the second side;
a substrate mounted on the contact member; and
an electronic circuit disposed between the electric device and the substrate.

(30)
An electric device having a first side and a second side, comprising:
a power reception device disposed along the first side;
a contact member disposed along the second side;
a substrate mounted on the contact member; and
an electronic circuit disposed between the electric device and the substrate.

(31)
A system comprising:
a power reception device including
a first contact member and an electronic circuit;
a first substrate mounted on the first contact member; and
a power source device including
a second contact member disposed on a second substrate,
wherein the first contact member is configured to face the second contact member when the power reception device and the power source device come into a contact.

(32)
The power reception device according to (29), wherein the substrate is a printed circuit board substrate.

(33)
The power reception device according to (29), wherein the electronic circuit is comprised of at least one of a rectification circuit, a matching circuit, a regulator, and a control section.

(34)
The power reception device according to (29), further comprising:
a battery disposed adjacent to the electronic circuit and the substrate;
a transformer disposed on the substrate; and
a heat conduction section configured to be in contact with the battery, the transformer, the substrate, and the contact member.

(35)
The power reception device according to (34), further comprising a connector configured to connect the electric device and the transformer.

(36)
The power reception device according to (29), further comprising a heat storage section disposed below the electric device and mounted on the battery.

(37)
The electric device according to (30), wherein the substrate is a printed circuit board substrate.

(38)
The electric device according to (30), wherein the electronic circuit is comprised of at least one of a rectification circuit, a matching circuit, a regulator, and a control section.

(39)
The electric device according to (30), further comprising:
a battery disposed adjacent to the electronic circuit and the substrate;
a transformer disposed on the substrate; and
a heat conduction section configured to be in contact with the battery, the transformer, the substrate, and the contact member.

(40)
The electric device according to (29), further comprising a connector configured to connect the electric device and the transformer.

(41)
The electric device according to (30), further comprising a heat storage section mounted on the battery.

(42)
The system according to (31), wherein the first substrate and the second substrate are printed circuit board substrates.

(43)
The system according to (31), wherein the electronic circuit is comprised of at least one of a rectification circuit, a matching circuit, a regulator, and a control section.

(44)
The system according to (31), further comprising:
a battery disposed adjacent to the electronic circuit and the first substrate;
a transformer disposed on the first substrate; and
a heat conduction section configured to be in contact with the battery, the transformer, the first substrate, the first contact member, the second substrate, and the second contact member.

(45)
The system according to (44), further comprising a connector configured to connect the electric device and the transformer.

(46)
The system according to (31), further comprising a heat storage section disposed below the electric device and mounted on the battery.

(47)
The system according to (31), wherein the first contact member and the second contact member are substantially the same in length and size.

(48)
The system according to (31), wherein the second substrate is longer than the first substrate.

It should be understood by those skilled in the art that various modifications, combinations, sub-combinations and alterations may occur depending on design requirements and other factors insofar as they are within the scope of the appended claims or the equivalents thereof.

REFERENCE SIGNS LIST 1, 1C, 1D, 2 Power source device
6, 6A, 6B Mobile phone
7 Transmission and reception section
8 Power transmission section
9 Feeding device
10 Power source section
11 Power reception section
12 Rectification circuit
13 Matching circuit
14 Regulator
15 Transformer
16 Battery
19 Heating component
20, 20D, 80 Heat storage section
21 Metallic film
30 Detection section
31 Temperature sensor
32 Pressure sensor
33 Resistance sensor
40, 40C, 50 Control section
41, 51 ADC
42 Transmission and reception section
43 Display section
60, 60B Enclosure
61 Heat conduction section
62 Coil
63 Substrate
64 Electronic circuit
65 Connector
66 Heat radiator
67, 68, 81, 82 Thermal buffer
70 Enclosure
72 Coil
73 Substrate
91 Heat conduction section
92 Heat transfer section

The invention claimed is:

1. A power receiving apparatus, comprising:
a power receiving circuit including a power receiving coil configured to receive a wireless power transmitted from a power transmitting apparatus;
a heat storage section;
a detection circuit configured to detect a temperature of the heat storage section; and
a control circuit configured to calculate a value based on the temperature of the heat storage section and to compare the calculated value with a first threshold value and a second threshold value,
wherein
when the calculated value is higher than the first threshold value and is lower than the second threshold value, the control circuit causes the power receiving apparatus to transmit a first request to the power transmitting apparatus, the first request requesting the power transmitting apparatus to decrease an amount of the wireless power, and
when the calculated value is higher than the second threshold value, the control circuit causes the power receiving apparatus to transmit a second request to the power transmitting apparatus, the second request requesting the power transmitting apparatus to stop transmitting the wireless power.

2. The power receiving apparatus according to claim 1, wherein the detection circuit detects the temperature and at least one of an electric resistance value, a volume, stress, or a strain of the heat storage section.

3. The power receiving apparatus according to claim 1, further comprising:
at least one component thermally coupled to the heat storage section.

4. The power receiving apparatus according to claim 3, wherein the at least one component includes one or more of a semiconductor circuit, a display, a battery, or charging circuitry configured to charge the battery.

5. The power receiving apparatus according to claim 4, wherein the at least one component includes the charging circuitry, the charging circuitry being electrically connected to the power receiving circuit to receive power for charging the battery.

6. The power receiving apparatus according to claim 1, further comprising:
a heat dissipation component thermally coupled to the heat storage section.

7. A power receiving apparatus, comprising:
a power receiving circuit including a power receiving coil configured to receive a wireless power transmitted from a power transmitting apparatus;
a heat storage section;
a detection circuit configured to detect a temperature of the heat storage section; and
a control circuit configured to calculate a value based on the temperature of the heat storage section and to compare the calculated value with a first threshold value and a second threshold value.

8. The power receiving apparatus according to claim 7, wherein the detection circuit detects the temperature and at least one of an electric resistance value, a volume, stress, or a strain of the heat storage section.

9. The power receiving apparatus according to claim 7, further comprising:
at least one component thermally coupled to the heat storage section.

10. The power receiving apparatus according to claim 9, wherein the at least one component includes one or more of a semiconductor circuit, a display, a battery, or charging circuitry configured to charge the battery.

11. The power receiving apparatus according to claim 10, wherein the at least one component includes the charging circuitry, the charging circuitry being electrically connected to the power receiving circuit to receive power for charging the battery.

12. The power receiving apparatus according to claim 7, further comprising:
a heat dissipation component thermally coupled to the heat storage section.

13. A power transmitting system comprising:
a power receiving apparatus including:
a power receiving circuit including a power receiving coil configured to receive a wireless power transmitted from a power transmitting apparatus,
a heat storage section,
a detection circuit configured to detect a temperature of the heat storage section, and
a control circuit configured to calculate a value based on the temperature of the heat storage section and to compare the calculated value with a first threshold value and a second threshold value; and
a power transmitting apparatus, the power transmitting apparatus being configured to:
receive a first request from the power receiving apparatus and decrease an amount of the wireless power to the power receiving apparatus when the calculated value is higher than the first threshold value and is lower than the second threshold value, and
receive a second request from the power receiving apparatus and stop transmitting the wireless power to the power receiving apparatus when the calculated value is higher than the second threshold value.

14. The power transmitting system according to claim 13, wherein the detection circuit detects the temperature and at least one of an electric resistance value, a volume, stress, or a strain of the heat storage section.

15. The power transmitting system according to claim 13, wherein the power receiving apparatus includes at least one component thermally coupled to the heat storage section.

16. The power transmitting system according to claim 15, wherein the at least one component includes one or more of a semiconductor circuit, a display, a battery, or charging circuitry configured to charge the battery.

17. The power transmitting system according to claim 16, wherein the at least one component includes the charging circuitry, the charging circuitry being electrically connected to the power receiving circuit to receive power for charging the battery.

18. The power transmitting system according to claim 13, wherein the power receiving apparatus includes a heat dissipation component thermally coupled to the heat storage section.

19. The power receiving apparatus according to claim 7, wherein when the calculated value is higher than the first threshold value and is lower than the second threshold value, the control circuit causes the power receiving apparatus to transmit a first request to the power transmitting apparatus, the first request requesting the power transmitting apparatus to decrease an amount of the wireless power.

20. The power receiving apparatus according to claim 19, wherein when the calculated value is higher than the second threshold value, the control circuit causes the power receiving apparatus to transmit a second request to the power transmitting apparatus, the second request requesting the power transmitting apparatus to stop transmitting the wireless power.

21. A power transmitting system comprising:
a power transmission apparatus including a power transmitting coil configured to transmit a wireless power to a power receiving circuit,
s power receiving apparatus including:
a heat storage section,
a detection circuit configured to detect a temperature of the heat storage section, and
a control circuit configured to calculate a value based on the temperature of the heat storage section and to compare the calculated value with a first threshold value and a second threshold value.

22. The power transmitting system according to claim 21, wherein when the calculated value is higher than the first threshold value and is lower than the second threshold value, the control circuit causes the power receiving apparatus to transmit a first request to the power transmitting apparatus, the first request requesting the power transmitting apparatus to decrease an amount of the wireless power.

23. The power transmitting system according to claim 22, wherein when the calculated value is higher than the second threshold value, the control circuit causes the power receiving apparatus to transmit a second request to the power transmitting apparatus, the second request requesting the power transmitting apparatus to stop transmitting the wireless power.

* * * * *